US012563749B2

(12) United States Patent
Guevara et al.

(10) Patent No.: US 12,563,749 B2
(45) Date of Patent: Feb. 24, 2026

(54) STACKED ELECTRONIC DEVICES

(71) Applicant: ADEIA SEMICONDUCTOR BONDING TECHNOLOGIES INC., San Jose, CA (US)

(72) Inventors: Gabriel Z. Guevara, Gilroy, CA (US); Belgacem Haba, Saratoga, CA (US); Cyprian Emeka Uzoh, San Jose, CA (US); Thomas Workman, San Jose, CA (US)

(73) Assignee: ADEIA SEMICONDUCTOR BONDING TECHNOLOGIES INC, San Jose, CA (US)

( * ) Notice: Subject to any disclaimer, the term of this patent is extended or adjusted under 35 U.S.C. 154(b) by 630 days.

(21) Appl. No.: 18/050,395

(22) Filed: Oct. 27, 2022

(65) Prior Publication Data

US 2023/0142680 A1     May 11, 2023

Related U.S. Application Data

(60) Provisional application No. 63/263,203, filed on Oct. 28, 2021.

(51) Int. Cl.
| | |
|---|---|
| *H10B 80/00* | (2023.01) |
| *H01L 23/00* | (2006.01) |
| *H01L 23/48* | (2006.01) |

(52) U.S. Cl.
CPC ........... *H10B 80/00* (2023.02); *H01L 23/481* (2013.01); *H01L 24/08* (2013.01); *H01L 24/80* (2013.01);
(Continued)

(58) Field of Classification Search
CPC .................... H01L 24/08; H01L 24/80; H01L 2224/08121; H01L 2224/08146;
(Continued)

(56) References Cited

U.S. PATENT DOCUMENTS

| | | | |
|---|---|---|---|
| 5,753,536 A | 5/1998 | Sugiyama et al. |
| 5,771,555 A | 6/1998 | Eda et al. |
| (Continued) | | | |

FOREIGN PATENT DOCUMENTS

| | | |
|---|---|---|
| JP | 2013-033786 A | 2/2013 |
| JP | 2018-160519 | 10/2018 |
| WO | WO 2005/043584 A2 | 5/2005 |

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/(published Nov. 8, 2018; downloaded Jul. 26, 2023).
(Continued)

*Primary Examiner* — Mamadou L Diallo
(74) *Attorney, Agent, or Firm* — Knobbe, Martens, Olson & Bear, LLP

(57) ABSTRACT

Disclosed is a stacked electronic device including a first and second bonded structure. The first bonded structure includes a first and second semiconductor element, each having a semiconductor region, a front side on one side of the semiconductor region including active circuitry, and a back side opposite the front side. The front side of the first semiconductor element is bonded and electrically connected to the front side of the second semiconductor element. The second bonded structure includes a third and fourth semiconductor element, which can include similar components to the first and second semiconductor elements. The front side of the third semiconductor element is bonded and electrically connected to the front side of the fourth semiconductor element. The back side of the second semiconductor element (Continued)

is bonded and electrically connected to the back side of the third semiconductor element.

22 Claims, 18 Drawing Sheets

(52) U.S. Cl.
CPC .............. *H01L 2224/08121* (2013.01); *H01L 2224/08146* (2013.01); *H01L 2224/08225* (2013.01); *H01L 2224/80895* (2013.01); *H01L 2224/80896* (2013.01); *H01L 2924/1436* (2013.01); *H01L 2924/3511* (2013.01)

(58) Field of Classification Search
CPC . H01L 2224/80895; H01L 2224/80896; H01L 23/481; H01L 2224/08225; H01L 2924/1436; H01L 21/76898; H01L 2225/06541; H01L 2225/06565; H01L 25/0657; H10B 80/00
See application file for complete search history.

(56) References Cited

U.S. PATENT DOCUMENTS

| | | | |
|---|---|---|---|
| 6,080,640 | A | 6/2000 | Gardner et al. |
| 6,423,640 | B1 | 7/2002 | Lee et al. |
| 6,465,892 | B1 | 10/2002 | Suga |
| 6,496,404 | B1 | 12/2002 | Fiedler et al. |
| 6,560,148 | B2 | 5/2003 | Takami et al. |
| 6,803,610 | B2 | 10/2004 | Koolhaas et al. |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,707,087 | B2 | 7/2020 | Uzoh et al. |
| 10,727,205 | B2 * | 7/2020 | Wu ...................... H01L 23/528 |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,152,276 | B2 * | 10/2021 | Li ...................... H01L 25/0657 |
| 11,158,573 | B2 | 10/2021 | Uzoh et al. |
| 11,158,606 | B2 | 10/2021 | Gao et al. |
| 11,169,326 | B2 | 11/2021 | Huang et al. |
| 11,171,117 | B2 | 11/2021 | Gao et al. |
| 11,176,450 | B2 | 11/2021 | Teig et al. |
| 11,195,748 | B2 | 12/2021 | Uzoh et al. |
| 11,205,625 | B2 | 12/2021 | DeLaCruz et al. |
| 11,239,203 | B2 * | 2/2022 | Gaide ...................... H01L 25/50 |
| 11,244,920 | B2 | 2/2022 | Uzoh |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,282,816 | B2 * | 3/2022 | Yu ...................... H10B 12/315 |
| 11,296,044 | B2 | 4/2022 | Gao et al. |
| 11,296,053 | B2 | 4/2022 | Uzoh et al. |
| 11,329,034 | B2 | 5/2022 | Tao et al. |
| 11,348,898 | B2 | 5/2022 | DeLaCruz et al. |
| 11,355,404 | B2 | 6/2022 | Gao et al. |
| 11,355,443 | B2 | 6/2022 | Huang et al. |
| 11,367,652 | B2 | 6/2022 | Uzoh et al. |
| 11,373,963 | B2 | 6/2022 | DeLaCruz et al. |
| 11,380,597 | B2 | 7/2022 | Katkar et al. |
| 11,385,278 | B2 | 7/2022 | DeLaCruz et al. |
| 11,387,202 | B2 | 7/2022 | Haba et al. |
| 11,387,214 | B2 | 7/2022 | Wang et al. |
| 11,393,779 | B2 | 7/2022 | Gao et al. |

(56) References Cited

U.S. PATENT DOCUMENTS

| | | | |
|---|---|---|---|
| 11,462,419 | B2 | 10/2022 | Haba |
| 11,476,213 | B2 | 10/2022 | Haba et al. |
| 11,515,291 | B2 | 11/2022 | DeLaCruz et al. |
| 11,557,581 | B2 * | 1/2023 | Chen ........................ H01L 24/97 |
| 11,868,174 | B2 * | 1/2024 | Gaide ................. H01L 25/0657 |
| 11,916,012 | B2 * | 2/2024 | Chen ................... H01L 21/6835 |
| 2004/0084414 | A1 | 5/2004 | Sakai et al. |
| 2004/0235305 | A1 | 11/2004 | Lojek |
| 2006/0057945 | A1 | 3/2006 | Hsu et al. |
| 2007/0111386 | A1 | 5/2007 | Kim et al. |
| 2014/0175655 | A1 | 6/2014 | Chen et al. |
| 2015/0064498 | A1 | 3/2015 | Tong |
| 2016/0343682 | A1 | 11/2016 | Kawasaki |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190580 | A1 | 7/2018 | Haba et al. |
| 2018/0190583 | A1 | 7/2018 | DeLaCruz et al. |
| 2018/0219038 | A1 | 8/2018 | Gambino et al. |
| 2018/0323177 | A1 | 11/2018 | Yu et al. |
| 2018/0323227 | A1 | 11/2018 | Zhang et al. |
| 2018/0331066 | A1 | 11/2018 | Uzoh et al. |
| 2019/0115277 | A1 | 4/2019 | Yu et al. |
| 2019/0131277 | A1 | 5/2019 | Yang et al. |
| 2019/0333550 | A1 | 10/2019 | Fisch |
| 2019/0385935 | A1 | 12/2019 | Gao et al. |
| 2020/0013765 | A1 | 1/2020 | Fountain, Jr. et al. |
| 2020/0035641 | A1 | 1/2020 | Fountain, Jr. et al. |
| 2020/0294908 | A1 | 9/2020 | Haba et al. |
| 2020/0328162 | A1 | 10/2020 | Haba et al. |
| 2020/0395321 | A1 | 12/2020 | Katkar et al. |
| 2021/0098412 | A1 | 4/2021 | Haba et al. |
| 2021/0104493 | A1 * | 4/2021 | Vodrahalli .......... H01L 25/0657 |
| 2021/0118864 | A1 | 4/2021 | DeLaCruz et al. |
| 2021/0143125 | A1 | 5/2021 | DeLaCruz et al. |
| 2021/0181510 | A1 | 6/2021 | Katkar et al. |
| 2021/0193603 | A1 | 6/2021 | DeLaCruz et al. |
| 2021/0193624 | A1 | 6/2021 | DeLaCruz et al. |
| 2021/0193625 | A1 | 6/2021 | Katkar et al. |
| 2021/0242152 | A1 | 8/2021 | Fountain, Jr. et al. |
| 2021/0296282 | A1 | 9/2021 | Gao et al. |
| 2021/0305202 | A1 | 9/2021 | Uzoh et al. |
| 2021/0366820 | A1 | 11/2021 | Uzoh |
| 2021/0375848 | A1 * | 12/2021 | Zhou ........................ H01L 24/09 |
| 2021/0407941 | A1 | 12/2021 | Haba |
| 2022/0013503 | A1 * | 1/2022 | Jung ................... H01L 25/0657 |
| 2022/0077063 | A1 | 3/2022 | Haba |
| 2022/0077087 | A1 | 3/2022 | Haba |
| 2022/0139867 | A1 | 5/2022 | Uzoh |
| 2022/0139869 | A1 | 5/2022 | Gao et al. |
| 2022/0208650 | A1 | 6/2022 | Gao et al. |
| 2022/0208702 | A1 | 6/2022 | Uzoh |
| 2022/0208723 | A1 | 6/2022 | Katkar et al. |
| 2022/0246497 | A1 | 8/2022 | Fountain, Jr. et al. |
| 2022/0285303 | A1 | 9/2022 | Mirkarimi et al. |
| 2022/0319901 | A1 | 10/2022 | Suwito et al. |
| 2022/0320035 | A1 | 10/2022 | Uzoh et al. |
| 2022/0320036 | A1 | 10/2022 | Gao et al. |
| 2023/0005850 | A1 | 1/2023 | Fountain, Jr. |
| 2023/0019869 | A1 | 1/2023 | Mirkarimi et al. |
| 2023/0036441 | A1 | 2/2023 | Haba et al. |
| 2023/0067677 | A1 | 3/2023 | Lee et al. |
| 2023/0069183 | A1 | 3/2023 | Haba |
| 2023/0100032 | A1 | 3/2023 | Haba et al. |
| 2023/0115122 | A1 | 4/2023 | Uzoh et al. |
| 2023/0122531 | A1 | 4/2023 | Uzoh |
| 2023/0123423 | A1 | 4/2023 | Gao et al. |
| 2023/0125395 | A1 | 4/2023 | Gao et al. |
| 2023/0130259 | A1 | 4/2023 | Haba et al. |
| 2023/0132632 | A1 | 5/2023 | Katkar et al. |
| 2023/0140107 | A1 | 5/2023 | Uzoh et al. |
| 2023/0154816 | A1 | 5/2023 | Haba et al. |
| 2023/0154828 | A1 | 5/2023 | Haba et al. |
| 2023/0187264 | A1 | 6/2023 | Uzoh et al. |
| 2023/0187317 | A1 | 6/2023 | Uzoh |
| 2023/0187412 | A1 | 6/2023 | Gao et al. |
| 2023/0197453 | A1 | 6/2023 | Fountain, Jr. et al. |
| 2023/0197496 | A1 | 6/2023 | Theil |
| 2023/0197559 | A1 | 6/2023 | Haba et al. |
| 2023/0197560 | A1 | 6/2023 | Katkar et al. |
| 2023/0197655 | A1 | 6/2023 | Theil et al. |
| 2023/0207402 | A1 | 6/2023 | Fountain, Jr. et al. |
| 2023/0207437 | A1 | 6/2023 | Haba |
| 2023/0207474 | A1 | 6/2023 | Uzoh et al. |
| 2023/0207514 | A1 | 6/2023 | Gao et al. |
| 2023/0207525 | A1 | 6/2023 | Mallik et al. |
| 2023/0215836 | A1 | 7/2023 | Haba et al. |
| 2023/0245950 | A1 | 8/2023 | Haba et al. |
| 2023/0268300 | A1 | 8/2023 | Uzoh et al. |
| 2023/0299029 | A1 | 9/2023 | Theil et al. |
| 2023/0343734 | A1 | 10/2023 | Uzoh et al. |
| 2023/0360950 | A1 | 11/2023 | Gao |
| 2023/0361074 | A1 | 11/2023 | Uzoh et al. |
| 2023/0369136 | A1 | 11/2023 | Uzoh et al. |
| 2023/0375613 | A1 | 11/2023 | Haba et al. |
| 2024/0038702 | A1 | 2/2024 | Uzoh |
| 2024/0055407 | A1 | 2/2024 | Workman |
| 2024/0079376 | A1 | 3/2024 | Suwito et al. |
| 2024/0105674 | A1 | 3/2024 | Uzoh et al. |
| 2024/0170411 | A1 | 5/2024 | Chang et al. |
| 2024/0186248 | A1 | 6/2024 | Haba et al. |
| 2024/0186268 | A1 | 6/2024 | Uzoh et al. |
| 2024/0186269 | A1 | 6/2024 | Haba |
| 2024/0203917 | A1 | 6/2024 | Katkar et al. |
| 2024/0213191 | A1 | 6/2024 | Theil et al. |
| 2024/0213210 | A1 | 6/2024 | Haba et al. |
| 2024/0217210 | A1 | 7/2024 | Zhao et al. |
| 2024/0222239 | A1 | 7/2024 | Gao et al. |
| 2024/0222315 | A1 | 7/2024 | Uzoh |
| 2024/0222319 | A1 | 7/2024 | Gao et al. |
| 2024/0266255 | A1 | 8/2024 | Haba et al. |
| 2024/0298454 | A1 | 9/2024 | Haba |
| 2024/0304593 | A1 | 9/2024 | Uzoh |
| 2024/0312951 | A1 | 9/2024 | Theil et al. |
| 2024/0332184 | A1 | 10/2024 | Katkar et al. |
| 2024/0332227 | A1 | 10/2024 | Uzoh et al. |
| 2024/0332231 | A1 | 10/2024 | Uzoh |
| 2024/0332267 | A1 | 10/2024 | Haba et al. |
| 2024/0387419 | A1 | 11/2024 | Mrozek et al. |
| 2025/0004197 | A1 | 1/2025 | Haba et al. |
| 2025/0006632 | A1 | 1/2025 | Chang et al. |
| 2025/0006642 | A1 | 1/2025 | Haba et al. |
| 2025/0006674 | A1 | 1/2025 | Uzoh et al. |
| 2025/0006679 | A1 | 1/2025 | Theil et al. |
| 2025/0006689 | A1 | 1/2025 | Uzoh et al. |
| 2025/0054854 | A1 | 2/2025 | Katkar et al. |
| 2025/0079364 | A1 | 3/2025 | Uzoh et al. |
| 2025/0096191 | A1 | 3/2025 | Gao et al. |
| 2025/0112123 | A1 | 4/2025 | Katkar et al. |
| 2025/0185163 | A1 | 6/2025 | Zhao et al. |
| 2025/0210585 | A1 | 6/2025 | Fountain, Jr. et al. |
| 2025/0212554 | A1 | 6/2025 | Katkar et al. |
| 2025/0218903 | A1 | 7/2025 | Uzoh et al. |

OTHER PUBLICATIONS

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "ONSEMI AR0820.".

Sony IMX260 image, a first cross section of Sony product labeled IMX260, showing a hybrid bonded back side illuminated CMOS image sensor with a pad opening for a wire bond. The second image shows a second cross-section with peripheral probe and wire bond

(56)         References Cited

OTHER PUBLICATIONS pads in the bonded structure. The part in the images was shipped in Apr. 2016. Applicant makes No. representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences—Nanoscience and Nanotechnology, 2010, 11 pages.

Moyer, Bryon, "Will Monolithic 3D DRAM Happen?" Semiconductor Engineering, Sep. 9, 2021, semiengineering.com/will-monolithic-3d-dram-happen/, 14 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

* cited by examiner

STACKED ELECTRONIC DEVICES

CROSS-REFERENCE TO RELATED APPLICATIONS

Any and all applications for which a foreign or domestic priority claim is identified in the Application Data Sheet as filed with the present application are hereby incorporated by reference under 37 CFR § 157.

This application claims the benefit under 35 U.S.C. § 119(e) to U.S. Provisional Application No. 63/263,203, entitled "STACKED ELECTRONIC DEVICES," filed Oct. 28, 2021, the entire contents of which are hereby incorporated by reference herein in their entirety and for all purposes.

BACKGROUND

Field

The field relates to stacked electronic devices.

Description of the Related Art

Multiple semiconductor elements (such as integrated device dies and wafers) may be stacked on top of one another in various applications, such as high bandwidth memory (HBM) devices or other devices that utilize vertical integration. The stacked elements can electrically communicate with one another through arrays of contact pads and conductive features. It can be challenging to reliably, accurately, and densely stack multiple elements on top of one another while avoiding stress or damage to the dies.

BRIEF DESCRIPTION OF THE DRAWINGS

These aspects and others will be apparent from the following description of preferred embodiments and the accompanying drawings, which are meant to illustrate and not to limit the invention, wherein.

DETAILED DESCRIPTION

Figure 1A:
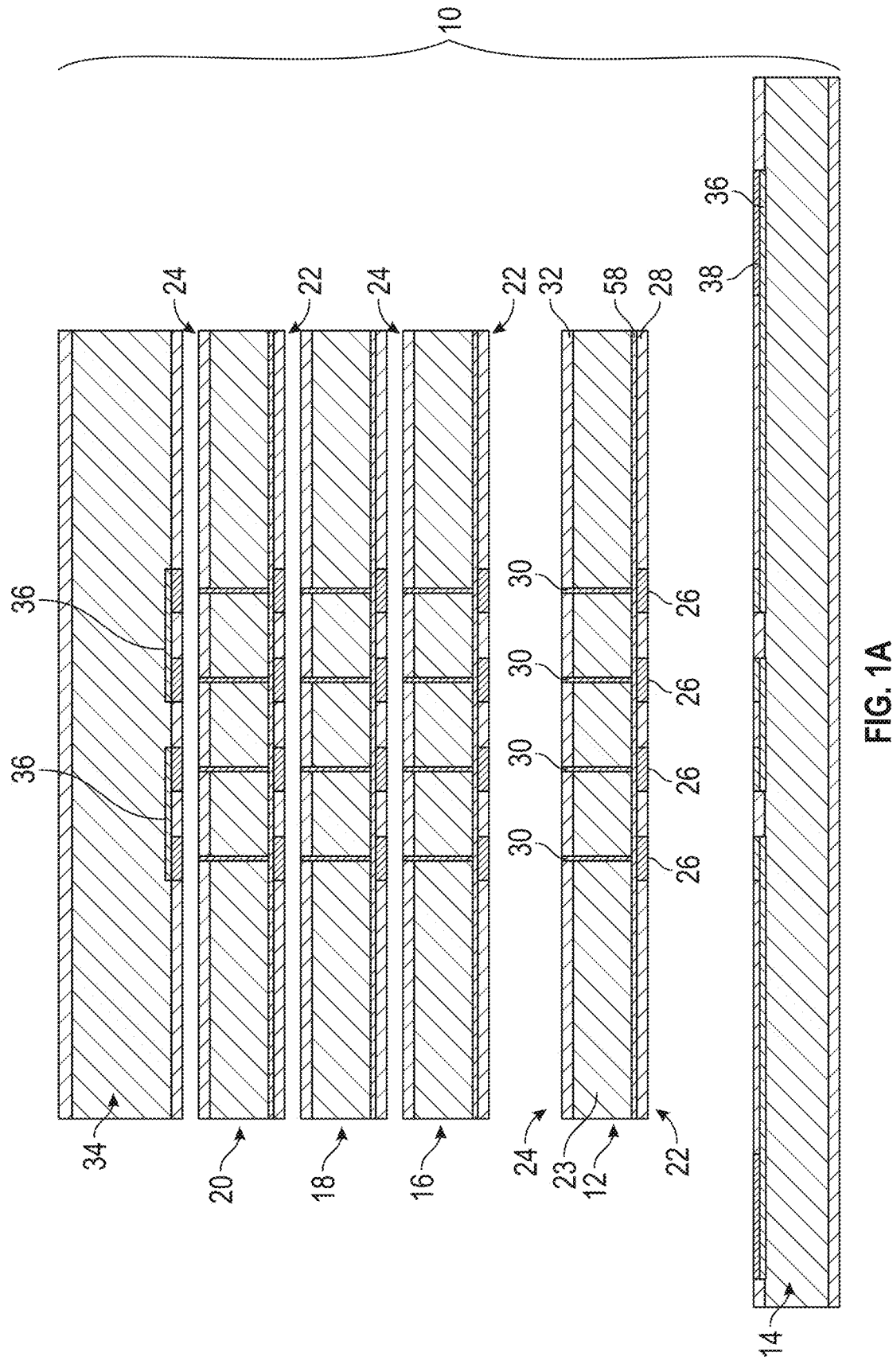
FIG. 1A is an exploded side sectional view of a stacked structure assembled using a conventional process for stacking integrated device dies.

Various embodiments disclosed herein relate to stacking a plurality of bonded structures on top of one another in a manner that improves density, area, form factor limits, and handling of stacked electronic devices. Hybrid direct bonding reduces the form factor constraints that exist with thermal compression bonding (TCB), and various embodiments disclosed herein represent further improvements in the field. Using TCB, for example, a traditional four-die stack using 50 micron-thick dies has a minimum thickness of the four dies plus at least three interfaces for TCB, which have an approximate height limit of 50 microns per layer of TCB interconnections. Therefore, a complete four-die stack using TCB is approximately (4×50 microns) 200 microns of silicon and at least (3×50 microns) 150 microns of TCB, totaling a minimum of approximately 350 microns. Direct hybrid bonding improves the form factor over TCB by allowing direct bonding of semiconductors (e.g., silicon). With direct hybrid bonding designs and implementations, the die count and thickness set the form factor limits. Using the previous example, four-50 micron thick dies that are stacked using direct hybrid bonding results in a stack of approximately 200 microns in thickness. Various embodiments disclosed herein allow for the same form factor of direct hybrid bonding but can in some instances double the density by creating a double-sided, back-to-back (or front-to-front or front-to-back or back-to-front) memory stack. Mirrored back-to-back (or front-to-front) die arrangements can have a 2× memory density advantage in the same form factor as a conventional single sided circuit. Various embodiments disclosed herein would, e.g., allow an 8 GB chip with four double-sided 50 micron direct hybrid bonding.

In some types of stacked electronic devices, it can be challenging to stack and bond multiple semiconductor elements (such as integrated device dies such as memory dies, and wafers) that are thinned. For example, stacking and bonding semiconductor elements that are 100 microns or less in thickness (or 50 microns or less in thickness) may be challenging, since handling the thinned semiconductor elements may cause the semiconductor elements to warp, resulting in reduced yield for the stacked structure. In various embodiments disclosed herein, thin first and second semiconductor elements 54, 74 can be bonded to one another to form a first bonded structure 52, and thin third and fourth semiconductor elements 108, 126 can be bonded to one another to form a second bonded structure 106 (see, e.g., FIG. 2A). The first and second bonded structures 52, 106 can subsequently be bonded to one another to form a stacked electronic device 50. Beneficially, separately forming the first and second bonded structures 52, 106 can facilitate easier handling for stacking by joining two thin dies together and handling the joined dies as a thicker unit, which can reduce warpage or damage induced by stresses in individual thinned dies. In various embodiments disclosed herein, multiple semiconductor elements (e.g., 54 and 74) can be stacked and handled as one bonded structure (e.g., bonded structure 52 as shown in, e.g., FIG. 2B). This improves conventional methods of thin-die stacking which are highly susceptible to voids during stacking due in part to warpage. Beneficially, various embodiments disclosed herein permit electronic devices to be processed by twos, instead of one at a time.

In various embodiments, the first and second bonded structures 52, 106 can be formed by directly bonding the first semiconductor element 54 to the second semiconductor element 74 without an intervening adhesive, and by directly bonding the third semiconductor element 108 to the fourth semiconductor element 126 without an intervening adhesive. The first and second bonded structures 52, 106 can, in turn, be directly bonded to one another without an intervening adhesive. In other embodiments, however, thermocompression bonding (TCB), solder bonding, or other bonding methods may be used to form the first and second bonded structures 52, 106, or to form the stacked electronic device 50 (e.g., to bond the first and second bonded structures 52, 106 together).

Figure 1B:
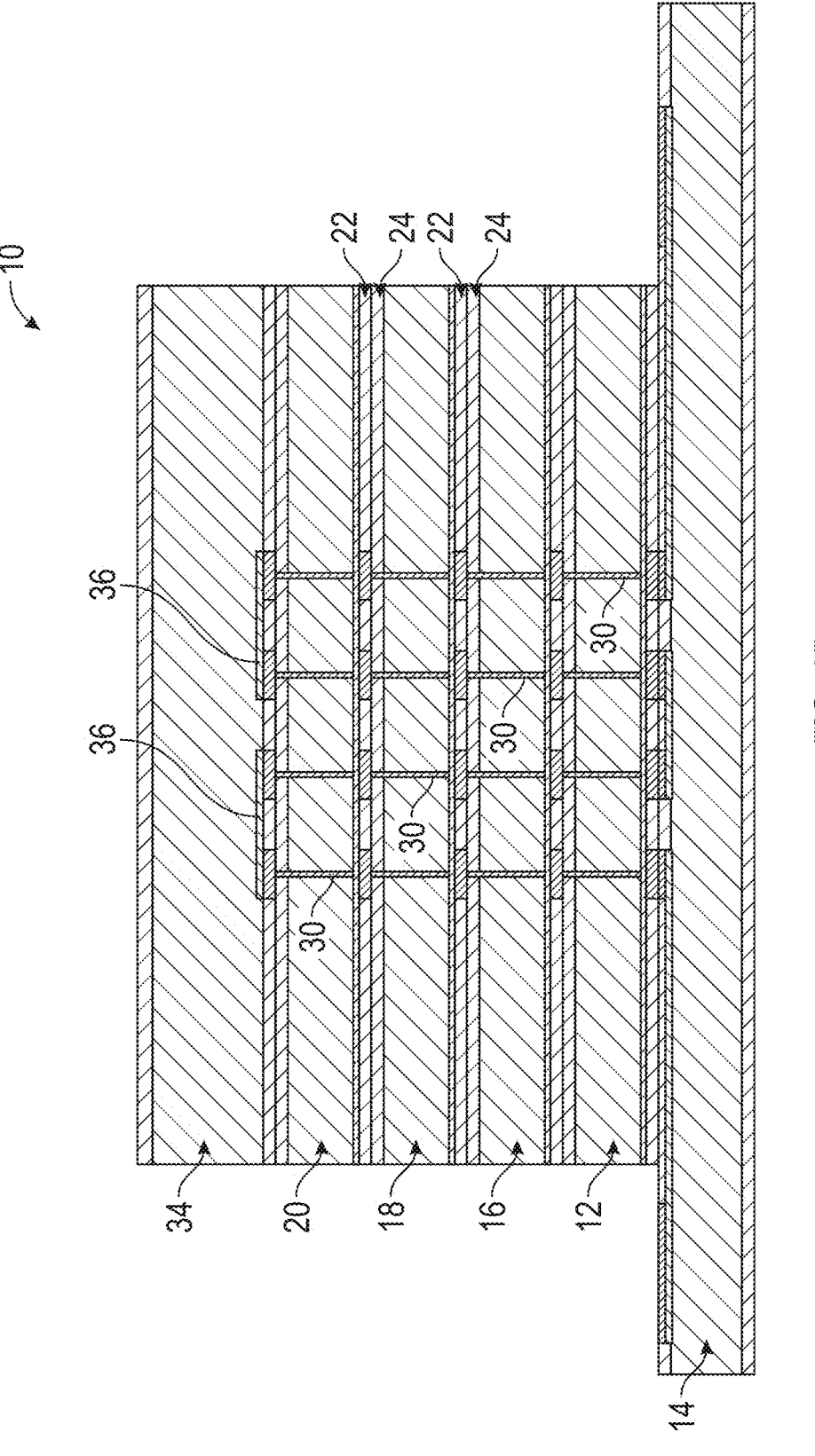
FIG. 1B is a schematic side sectional view of the stacked structure in FIG. 1A.
Figure 1C:
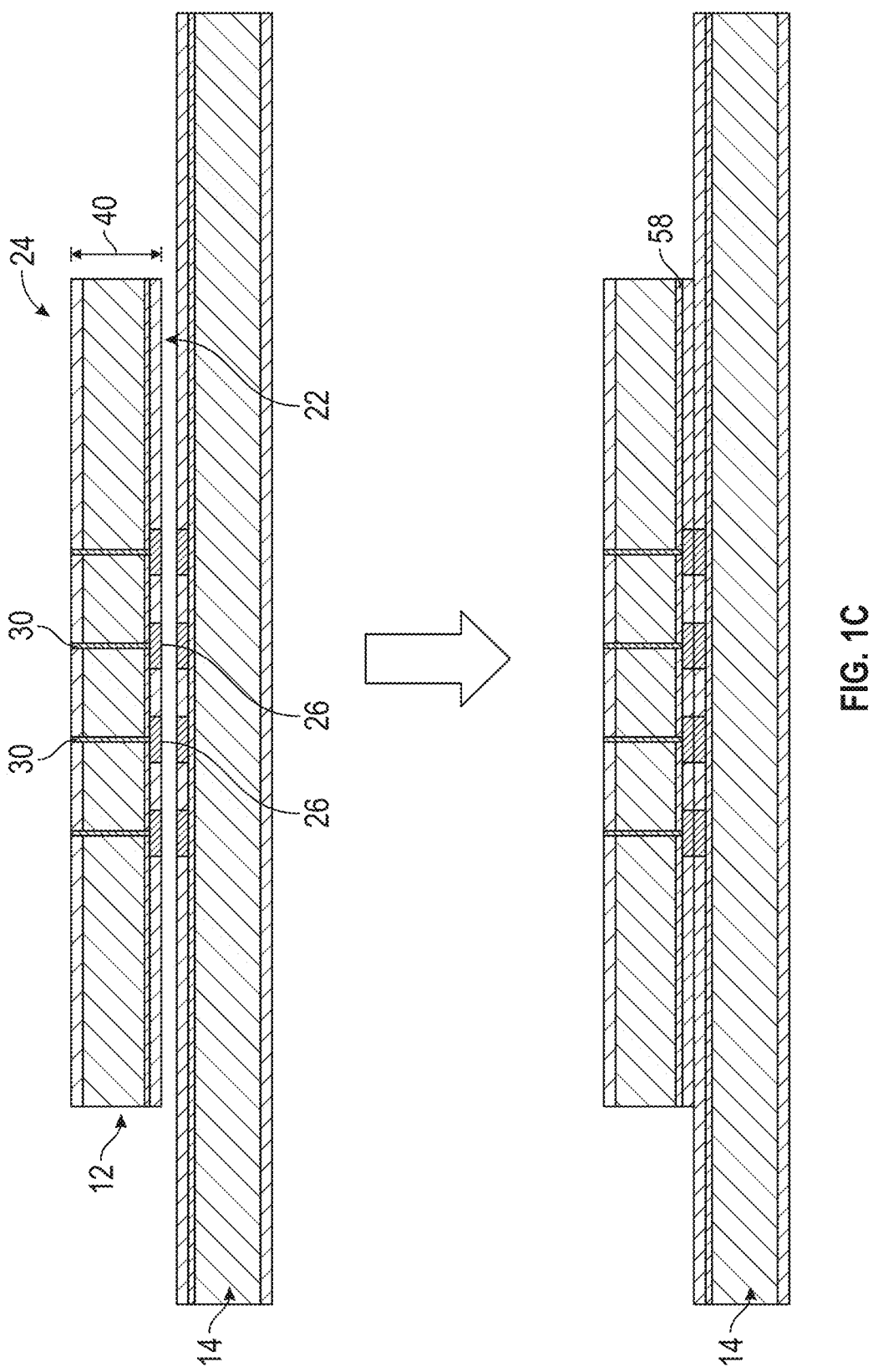
FIG. 1C is a schematic side sectional view of a sequence by which a die that is thinned can be bonded to a carrier using a conventional process.

FIGS. 1A-1C show a conventional process for stacking integrated device dies. Each die in FIGS. 1A-1C has a front side 22 and a back side 24 on opposite sides of a semiconductor region 23. Each front side 22 comprises contact pads 26 and nonconductive field regions 28. There is also active circuitry 58 on each front side 22. Each back side 24 has a plurality of through-substrate vias (TSVs) 30 that extend to the back side 24 and backside nonconductive field regions 32. To form a stacked structure 10, a first die 12 can be directly bonded to a carrier 14 (e.g., a host wafer or device or substrate). Subsequently, a second die 16 can be directly bonded to the first die 12. After bonding the second die 16, a third die 18 can be directly bonded to the second die 16. After bonding the third die 18, a fourth die 20 can be directly bonded to the third die 18. FIG. 1B shows the stacked structure 10 assembly, including a cap die 34, which comprises one or more redistribution layers (RDL) 36. The carrier 14 can also have an RDL, which can electrically connect at least one of the contact pads 26 to a test pad 38. An RDL can laterally transfer electrical signal.

FIG. 1C shows a die 12 that is thinned then bonded to a carrier 14. When handling individual thinned dies 12 (such as dies having a thickness 40 of 100 microns or less, or 50 microns or less), the bonding equipment may cause warpage (not shown) to the thinned dies 12.

Figure 2A:
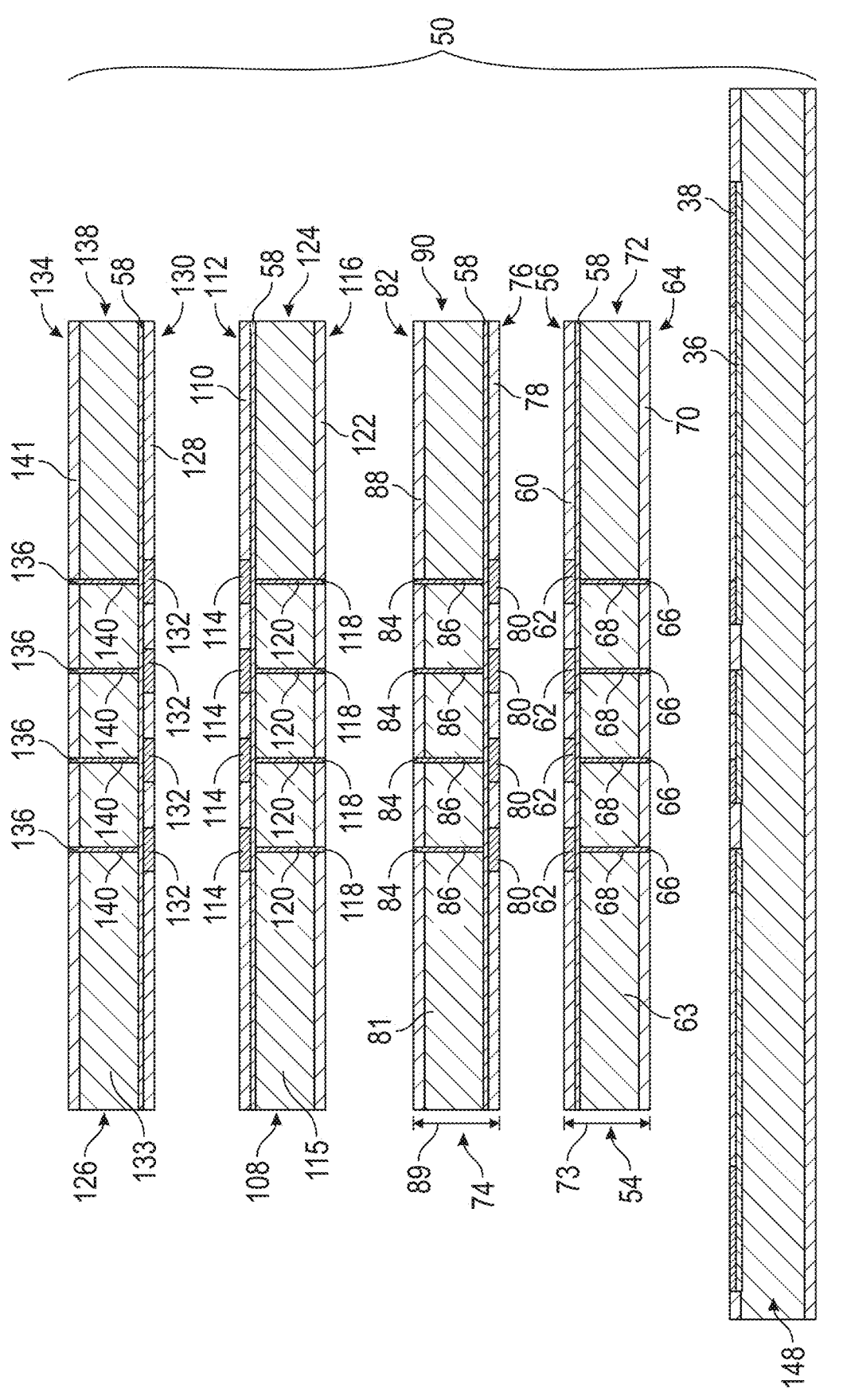
FIG. 2A is an exploded side sectional view of a stacked electronic device, according to one embodiment.

FIGS. 2A-2E illustrate various embodiments for forming a stacked electronic device 50. FIG. 2A illustrates various constituent features of one embodiment of a stacked electronic device 50. FIG. 2A shows, from bottom to top, a carrier 148, a first semiconductor element 54, a second semiconductor element 74, a third semiconductor element 108, and a fourth semiconductor element 126. The carrier 148 shown in FIG. 2A includes RDLs 36, which electrically connect the first semiconductor element 54 to a test pad 38. The four semiconductor elements 54, 74, 108, and 126 shown in FIG. 2A can have similar constituent parts.

The first semiconductor element 54 can include a first semiconductor region 63, a first front side 56 on one side of the first semiconductor region 63, a first back side 64 on the opposite side of the first semiconductor region 63 from the first front side 56, a first side edge 72, and a first thickness 73 of the first semiconductor element 54. The first front side 56 can include active circuitry 58 and a first plurality of contact pads 62 at least partially embedded in a first nonconductive field region 60. The first back side 64 can include a first backside nonconductive field region 70 and a first plurality of conductive features 66, wherein the first plurality of conductive features 66 includes a first plurality of through-substrate vias (TSVs) 68 that extend to the first back side 64.

The second semiconductor element 74 can include a second semiconductor region 81, a second front side 76 on one side of the second semiconductor region 81, a second back side 82 on the opposite side of the second semiconductor region 81 from the second front side 76, a second side edge 90, and a second thickness 89 of the second semiconductor element 74. The second front side 76 can include active circuitry 58 and a second plurality of contact pads 80 at least partially embedded in a second nonconductive field region 78. The second back side 82 can include a second backside nonconductive field region 88 and a second plurality of conductive features 84, wherein the second plurality of conductive features 84 includes a second plurality of TSVs 86 that extend to the second back side 82.

The third semiconductor element 108 can include a third semiconductor region 115, a third front side 112 on one side of the third semiconductor region 115, a third back side 116 on the opposite side of the third semiconductor region 115 from the third front side 112, and a third side edge 124. The third front side 112 can include active circuitry 58 and a third plurality of contact pads 114 at least partially embedded in a third nonconductive field region 110. The third back side 116 can include a third backside nonconductive field region 122 and a third plurality of conductive features 118, wherein the third plurality of conductive features 118 includes a third plurality of TSVs 120 that extend to the third back side 116.

The fourth semiconductor element 126 can include a fourth semiconductor region 133, a fourth front side 130 on one side of the fourth semiconductor region 133, a fourth back side 134 on the opposite side of the fourth semiconductor region 133 from the fourth front side 130, and a fourth side edge 138. The fourth front side 130 can include active circuitry 58 and a fourth plurality of contact pads 132 at least partially embedded in a fourth nonconductive field region 128. The fourth back side 134 can include a fourth backside nonconductive field region 141 and a fourth plurality of conductive features 136, wherein the fourth plurality of conductive features 136 includes a fourth plurality of TSVs 140 that extend to the fourth back side 134.

Figure 2B:
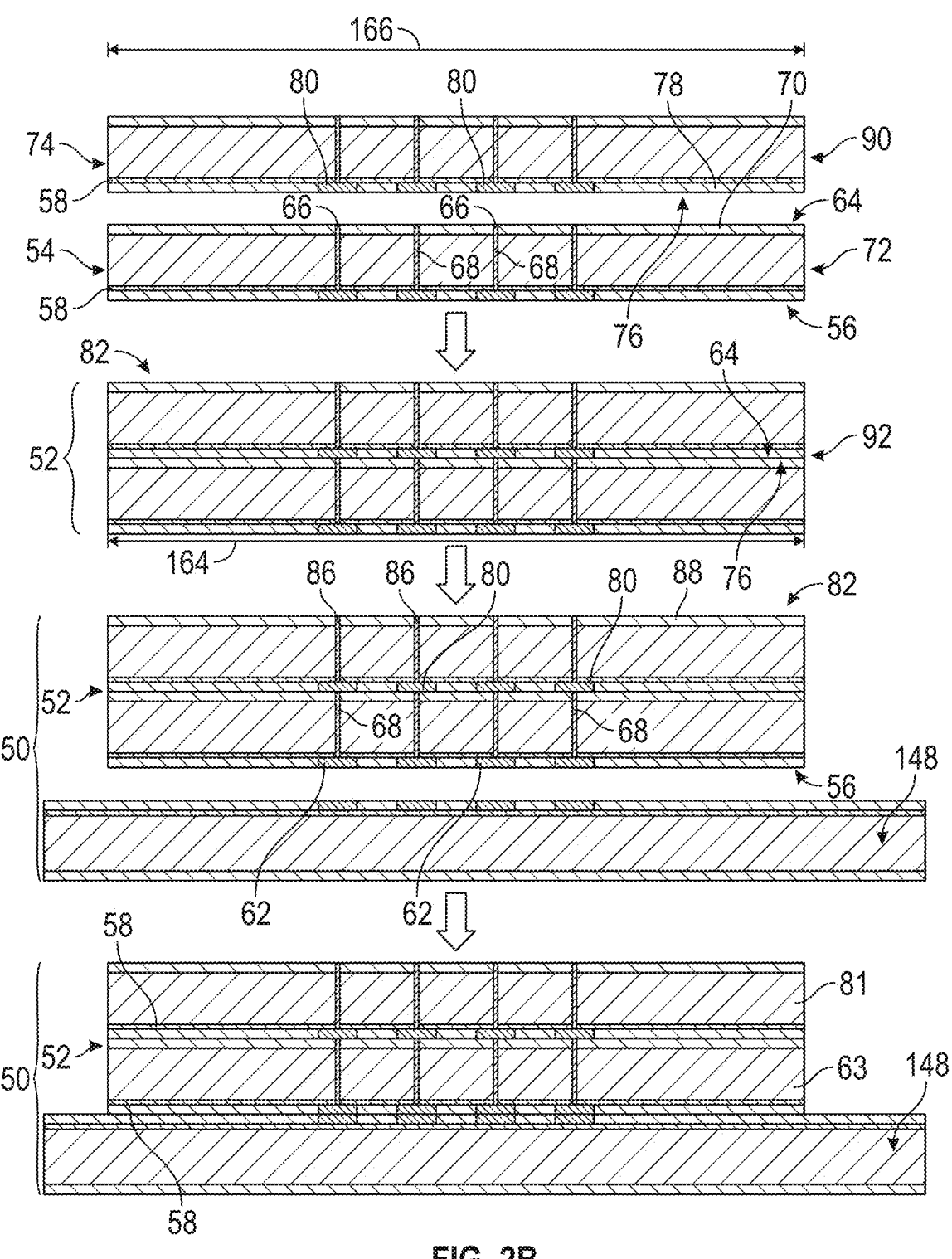
FIG. 2B is a schematic side sectional view of a sequence by which a stacked electronic device can be bonded to a carrier in a front-to-back configuration, according to one embodiment.

In FIG. 2B, the first back side 64 of the first semiconductor element 54 can be bonded (e.g., directly bonded) to the second front side 76 of the second semiconductor element 74 to form a first bonded structure 52. In embodiments in which the first and second semiconductor elements

54, 74 are directly bonded, the first backside nonconductive field region 70 on the first back side 64 of the first semiconductor element 54 and the second nonconductive field region 78 on the second front side 76 of the second semiconductor element 74 can be directly bonded without an intervening adhesive. The second plurality of contact pads 80 on the second front side 76 of the second semiconductor element 74 can be directly bonded to the first plurality of conductive features 66 exposed on the first back side 64 of the first semiconductor element 54. In some embodiments, the first plurality of conductive features 66 comprise a first plurality of TSVs 68 that extend to the first back side 64. In other embodiments (not shown), the first plurality of conductive features 66 exposed on the first back side 64 can be contact pads provided at the first back side 64 of the first semiconductor element 54. The first bonded structure 52 can subsequently be bonded (e.g., directly bonded) to the carrier 148. The carrier 148 can comprise a host wafer, substrate or device as shown. In some embodiments, the carrier 148 can comprise a semiconductor element (such as the first semiconductor element 54) or a bonded structure (such as the first bonded structure 52) including any of the semiconductor elements or bonded structures disclosed herein (e.g., a bonded die pair).

The first front side 56 of the first semiconductor element 54 and the second front side 76 of the second semiconductor element 74 can each have active circuitry 58 (e.g., one or multiple transistors) at or near the respective first front side 56 and second front side 76, such that the respective first front side 56 and second front side 76 comprise active sides or surfaces of the respective first semiconductor element 54 and second semiconductor element 74. In various embodiments, the first back side 64 of the first semiconductor element 54 and the second back side 82 of the second semiconductor element 74 may be devoid of active circuitry, and may comprise a backside nonconductive field region 70, 88 provided over a thinned back surface of the respective elements. In some embodiments, the first and second semiconductor elements 54, 74 can be directly bonded to one another in wafer form and, subsequently, singulated to form a singulated first bonded structure 52 including directly bonded first and second dies. In other embodiments, the first and second semiconductor elements 54, 74 can be bonded to one another in die form after singulation.

In various embodiments, the first and second semiconductor elements 54, 74 can be thinned after bonding. In various embodiments, the first and second semiconductor elements 54, 74 can be thinned before bonding. The thinned first and second semiconductor elements 54, 74 can each have a thickness of 100 microns or less, or 50 microns or less.

Figure 2C:
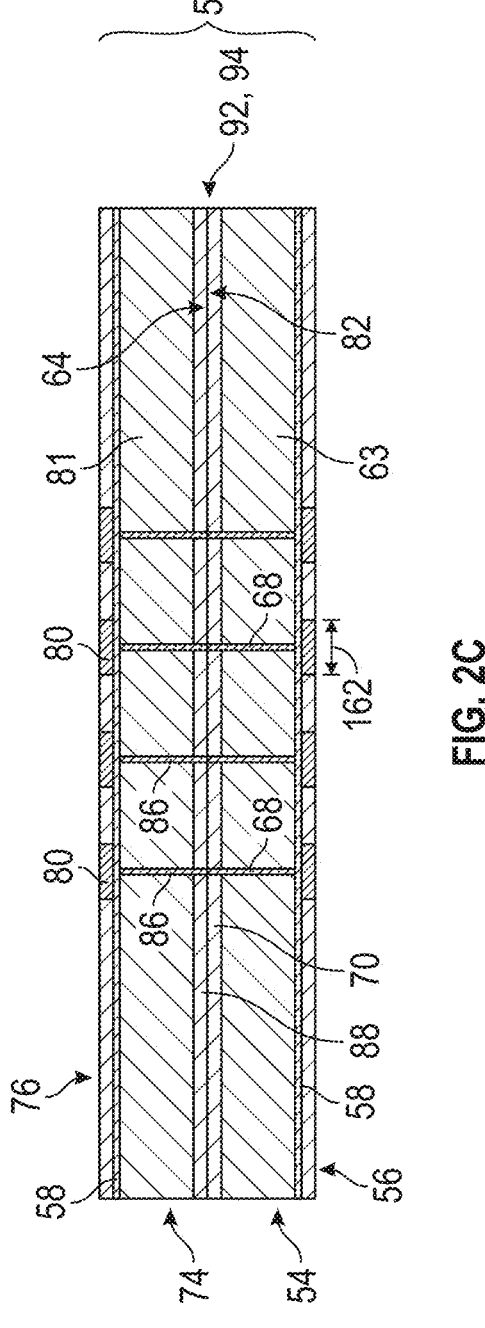
FIG. 2C is a schematic side sectional view of a first bonded structure in a back-to-back configuration, according to one embodiment.
Figure 2D:
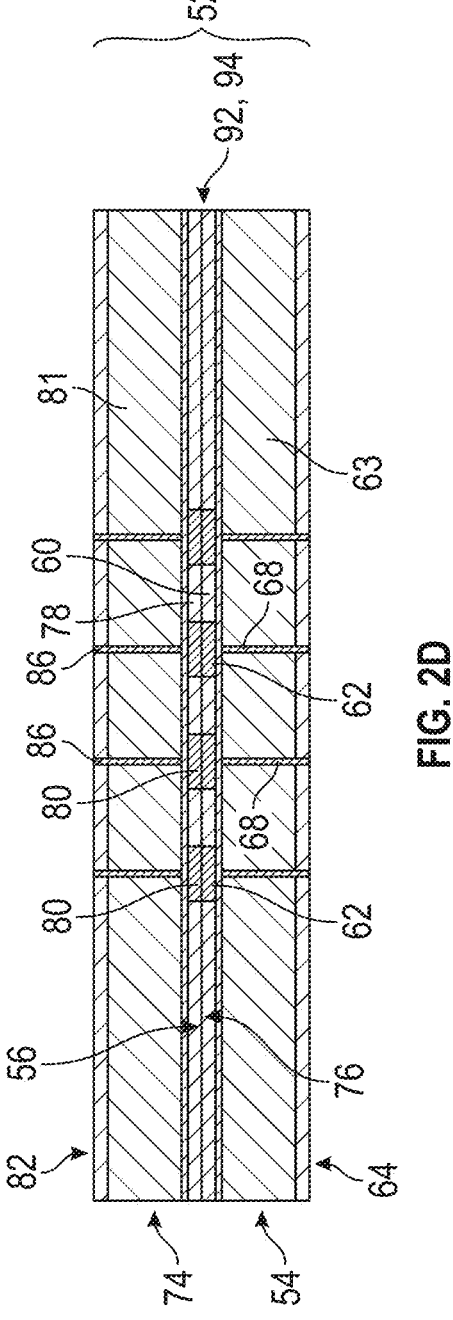
FIG. 2D is a schematic side sectional view of a first bonded structure in a front-to-front configuration, according to one embodiment.

The first bonded structure 52 can comprise the first semiconductor element 54 that is bonded and electrically connected to the second semiconductor element 74. In some embodiments (an example of which is shown in FIG. 2B), the first and second semiconductor elements 54, 74 are bonded and electrically connected in a "front-to-back" (or "F2B") configuration, in which the first back side 64 is bonded and electrically connected to the second front side 76. Another example (not shown) of a "front-to-back" configuration of the first bonded structure 52 would be one in which the first front side 56 is bonded and electrically connected to the second back side 82. In other embodiments (an example of which is shown in FIG. 2C), the first and second semiconductor elements 54, 74 are bonded and electrically connected in a "back-to-back" (or "B2B") configuration, in which the first back side 64 of the first semiconductor element 54 is bonded and electrically connected to the second back side 82 of the second semiconductor element 74. In yet other embodiments (an example of which is shown in FIG. 2D), the first and second semiconductor elements 54, 74 are bonded and electrically connected in a "front-to-front" (or "F2F") configuration, in which the first front side 56 of the first semiconductor element 54 is bonded and electrically connected to the second front side 76 of the second semiconductor element 74.

In some embodiments, the semiconductor elements (e.g., the first and second semiconductor elements 54, 74) are wafers that are bonded and electrically connected to one another before they are singulated into dies. In other embodiments, the semiconductor elements (e.g., the first and second semiconductor elements 54, 74) are dies that had previously been singulated. In yet other embodiments, one of the semiconductor elements (e.g., the first semiconductor element 54 or the second semiconductor element 74, but not both) is a wafer and the other semiconductor element is a die.

Beneficially, in various embodiments, bonding singulated B2B or F2F pairs of dies can allow easier handling (e.g., the ejection of the bonded pairs from dicing tape and flipping the pairs onto the bond tool), at least because, for dies of approximately the same thickness, the pair can be twice as thick as the individual die and can be significantly less fragile than a single thinned die. In such embodiments, the handling of individual thin dies is reduced or eliminated, which reduces thin die warpage. Various embodiments disclosed herein can be used wherein any of the semiconductor elements (e.g., the first, second, third or fourth semiconductor elements 54, 74, 108, or 126) are thinned dies having thicknesses in a range of 10 microns to 200 microns. For example, in some embodiments, the first thickness 73 of the thinned first semiconductor element 54 and the second thickness 89 of the thinned second semiconductor element 74 can each be in a range of 5 microns to 100 microns, 10 microns to 200 microns, 20 microns to 100 microns, in a range of 20 microns to 60 microns, in a range of 20 microns to 50 microns in a range of 10 microns to 50 microns, or in a range of 10 microns to 45 microns. In various embodiments, the first bonded structure 52 (e.g., a pair of directly bonded dies) can have a thickness 96 of the first bonded structure 52 of no more than 100 microns, no more than 90 microns, no more than 80 microns, or no more than 70 microns, e.g., in a range of 20 microns to 95 microns, in a range of 25 microns to 90 microns, or in a range of 30 microns to 85 microns.

Unlike in the embodiment of FIG. 2B, in the embodiment of FIG. 2C, the second back side 82 of the second semiconductor element 74 is bonded to the first back side 64 of the first semiconductor element 54 in a B2B configuration. For example, the first backside nonconductive field region 70 at the first back side 64 of the first semiconductor element 54 can be directly bonded to the second backside nonconductive field region 88 at the second back side 82 of the second semiconductor element 74 without an intervening adhesive. Additionally or alternatively, the first plurality of TSVs 68 exposed at the first back side 64 of the first semiconductor element 54 can be directly bonded to a second plurality of TSVs 86 exposed at the second back side 82 of the second semiconductor element 74 without an intervening adhesive. As explained above, in various embodiments, the first and second semiconductor elements 54, 74 can be directly bonded and singulated after bonding to form a singulated first bonded structure 52. In such embodiments, the side edges 72, 90 of the first and second semiconductor elements 54, 74 can be flush with one another—forming a side edge 92 of the first bonded structure 52—and can include first markings 94 indicative of the first singulation process (e.g., saw markings or striations).

Turning to FIG. 2D, the first front side 56 of the first semiconductor element 54 is bonded to the second front side 76 of the second semiconductor element 74 in an F2F configuration. For example, the first nonconductive field region 60 at the active first front side 56 of the first semiconductor element 54 can be directly bonded to the second nonconductive field region 78 at the active second front side 76 of the second semiconductor element 74 without an intervening adhesive. The first plurality of contact pads 62 disposed at the first front side 56 of the first semiconductor element 54 can be directly bonded to the second plurality of contact pads 80 disposed at the second front side 76 of the second semiconductor element 74 without an intervening adhesive. As explained above, in various embodiments, the first and second semiconductor elements 54, 74 can be directly bonded and singulated after bonding to form a singulated first bonded structure 52. In such embodiments, the side edges 72, 90 of the first and second semiconductor elements 54, 74 can be flush with one another—forming a side edge 92 of the first bonded structure 52—and can include first markings 94 indicative of the first singulation process (e.g., saw markings or striations).

Figure 2E:
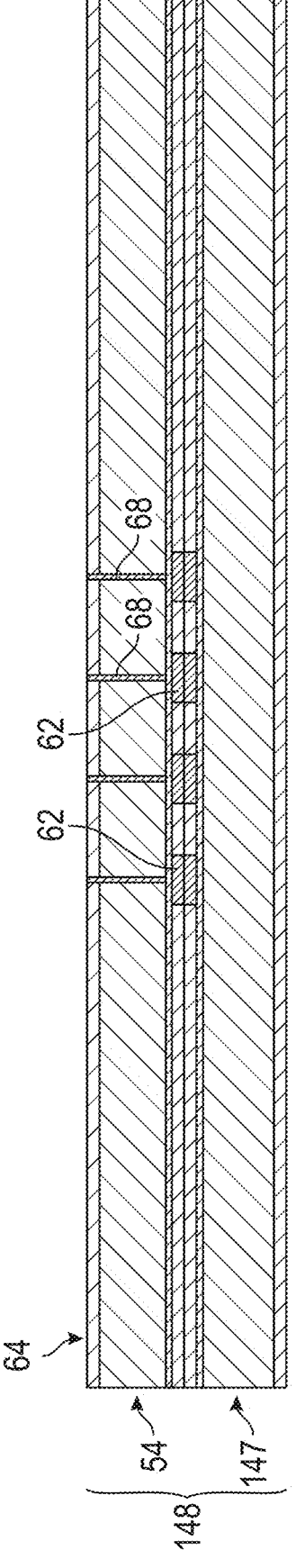
FIG. 2E is a schematic side sectional view of carrier comprising a semiconductor element bonded to a host wafer in a front-to-front configuration, according to one embodiment.

As shown in FIG. 2E, the carrier 148 can comprise a host wafer 147 or substrate or another bonded structure, and can include one or more dies mounted thereto (e.g., a first semiconductor element 54, which can comprise a semiconductor die). The embodiment shown in FIG. 2E shows the carrier 148 as a result of coupled mirrored die-to-wafer (or D2W) stacking, in which the die can be a semiconductor element 54 and the wafer can be a host wafer 147. The first bonded structure 52 and a second bonded structure 106 can be stacked on the carrier 148 as explained herein.

Figure 3A:
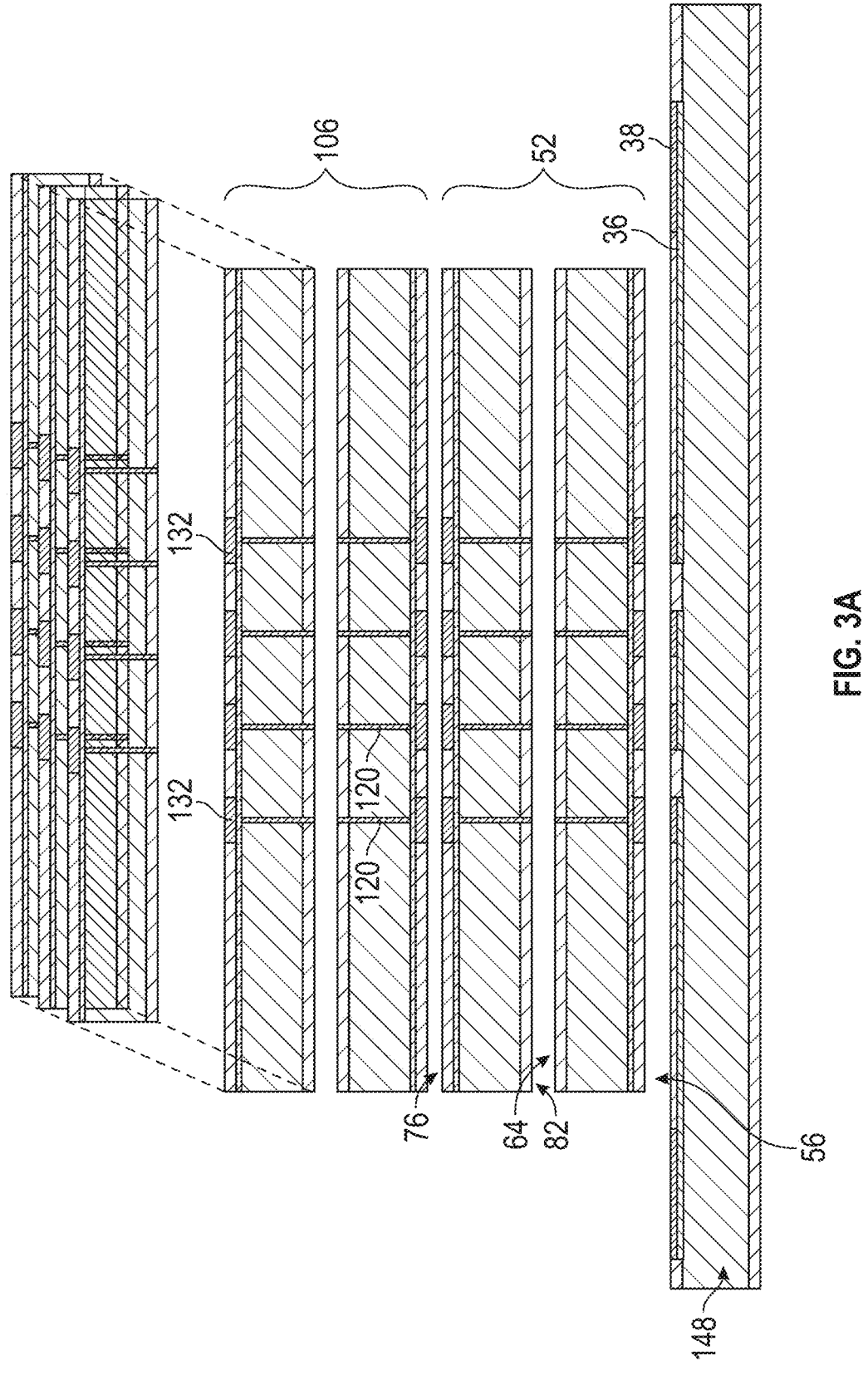
FIG. 3A is a schematic isometric view of a stacked electronic device according to various embodiments.
Figure 3B:
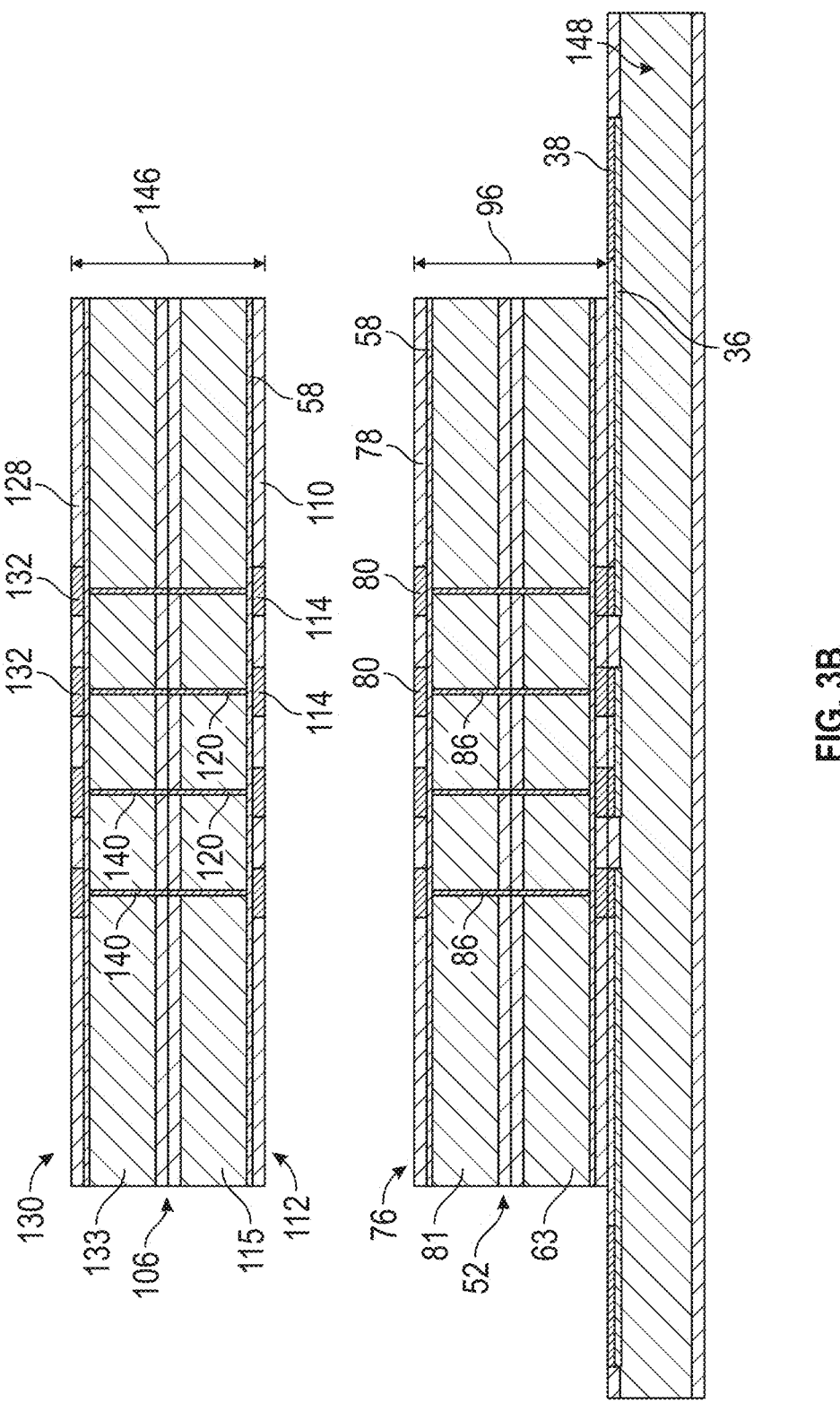
FIG. 3B is a schematic side sectional view of a first bonded structure bonded to a carrier and a second bonded structure prepared to be bonded to the first bonded structure, according to one embodiment.
Figure 3C:
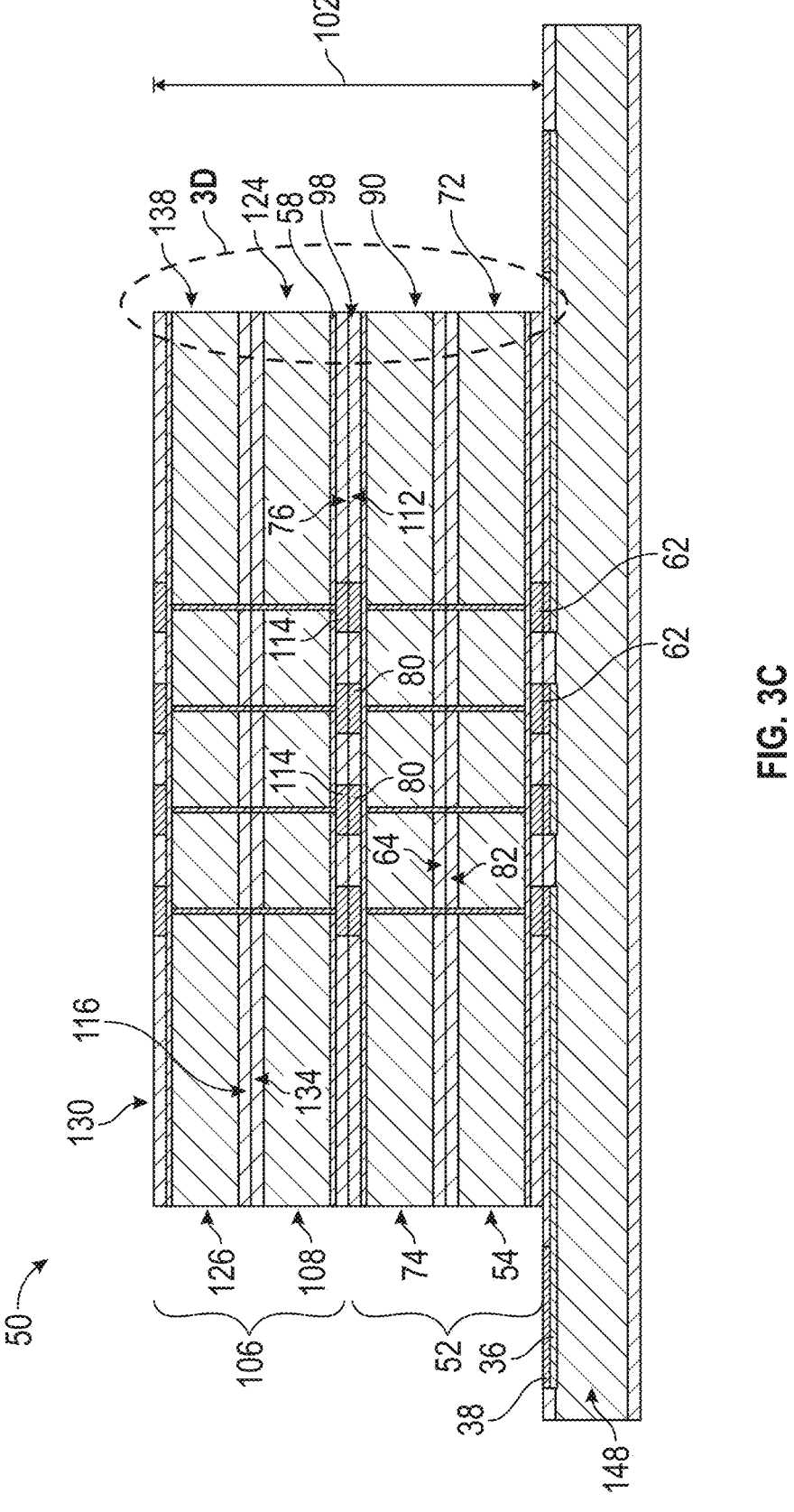
FIG. 3C is a schematic side sectional view of a stacked electronic device comprising two bonded structures directly bonded to one another on a carrier, according to one embodiment.

FIGS. 3A-3E illustrate a possible method for forming a stacked electronic device 50 including a plurality of bonded structures (e.g., 52, 106, 150, and 156, shown in FIG. 3E) bonded and electrically connected to one another. The sequence of FIGS. 3A-3E illustrates bonded structures 52, 106, 150, and 156 whose constituent semiconductor elements are bonded in a back-to-back (B2B) configuration, as shown in FIG. 2C. FIG. 3A shows an isometric view of an embodiment of a stacked electronic device. As shown in FIG. 3B, a first bonded structure 52 comprising bonded first and second semiconductor elements 54, 74 can be bonded to the carrier 148. In some embodiments, these first and second semiconductor elements 54, 74 can be device dies. Also as shown in FIG. 3B, the first bonded structure 52 has a thickness 96 of the first bonded structure 52, and the second bonded structure 106 has a thickness 146 of the second bonded structure 106. In FIG. 3C, a second bonded structure 106 comprising bonded third and fourth semiconductor elements 108, 126 can be bonded and stacked on the first bonded structure 52. In some embodiments, these third and fourth semiconductor elements 108, 126 can be device dies. As shown, the active third front side 112 of the third semiconductor element 108 of the second bonded structure 106 can be bonded to the active second front side 76 of the second semiconductor element 74 of the first bonded structure 52. In some embodiments, direct hybrid bonding of TSV interconnect between pairs can double a device's density while keeping the same footprint, such that, in one embodiment, 8 double-sided die pairs can comprise 16 layers of lithography, and thereby 16 layers of active circuitry 58.

Figure 3D:
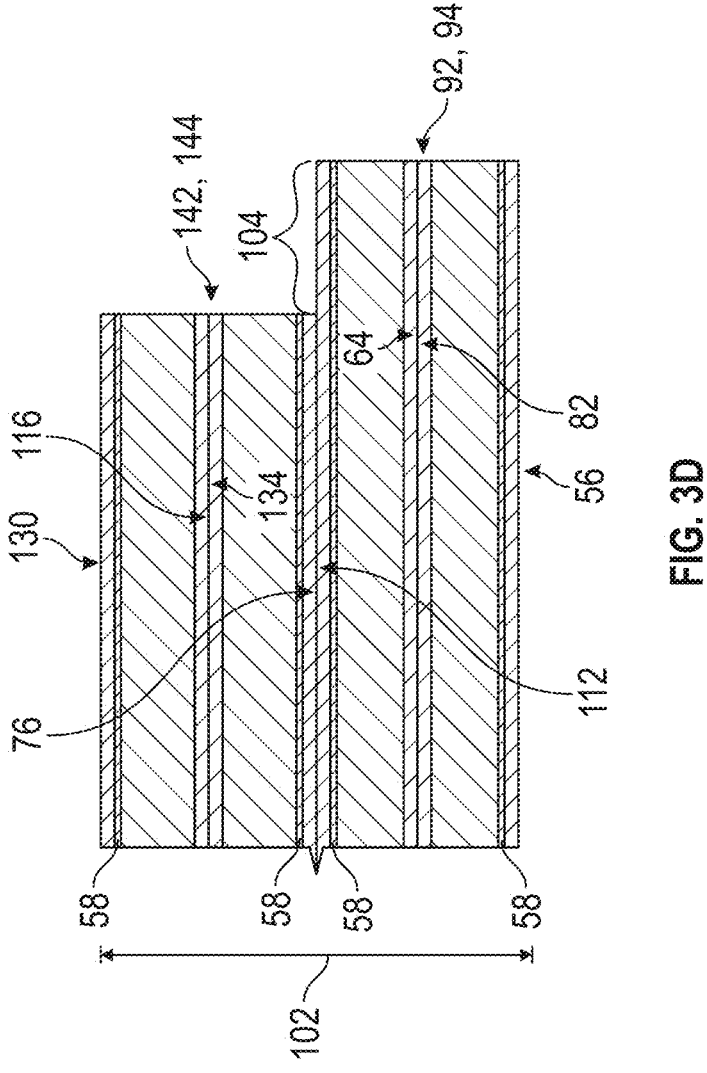
FIG. 3D is a schematic side sectional view of a side edge of the stacked first and second bonded structures, according to one embodiment.

As shown in FIG. 3D, the side edges 72, 90 of the first and second semiconductor elements 54, 74 (comprising singulated first and second dies) can be flush with one another to at least partially define a side edge 92 of the first bonded structure 52 and can include first markings 94 indicative of a first singulation process (e.g., saw markings or striations). Similarly, the side edges 124, 138 of the third and fourth semiconductor elements 108, 126 (comprising singulated third and fourth dies) can be flush with one another to at least partially define a side edge 142 of the second bonded structure 106 and can include second markings 144 indicative of a second singulation process (e.g., saw markings or striations), which can be different from the first singulation process. However, at least because the first bonded structure 52 is bonded to the second bonded structure 106 after singulation in this embodiment, there is typically a lateral misalignment 104 between the side edge 92 of the first bonded structure 52 and the side edge 142 of the second bonded structure 106, as shown in FIG. 3D. Although the conductive features of the first bonded structure 52 may be substantially aligned with those of the second bonded structure 106 so as to retain bonding and electrical connection, due to differences in singulation processes and to the use of a bonding tool to bond the first and second bonded structures 52, 106 together, the side edge 92 of the first bonded structure 52 may not be flush with (e.g., may have a lateral misalignment 104 relative to or offset from) the side edge 142 of the second bonded structure 106.

Figure 3E:
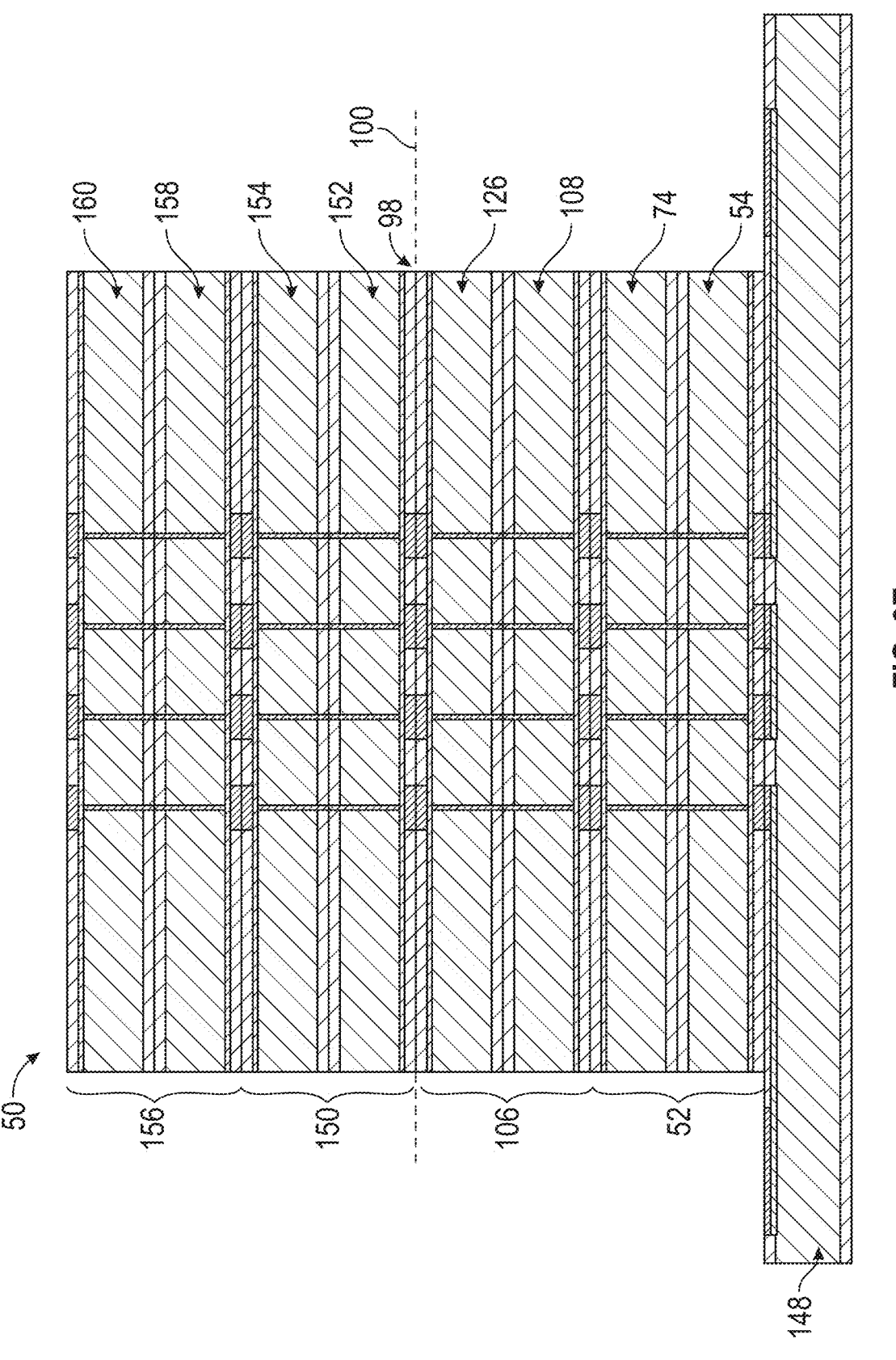
FIG. 3E is a schematic side sectional view of a stacked electronic device comprising a plurality of (e.g., four) bonded structures, according to one embodiment.

In FIG. 3E, a third bonded structure 150 (comprising a fifth and sixth semiconductor element 152, 154) can be stacked on the second bonded structure 106, and a fourth bonded structure 156 (comprising a seventh and eighth semiconductor element 158, 160) can be stacked on the third bonded structure 106. Thus, in the stacked electronic device 50 of FIG. 3E, four bonded structures 52, 106, 150, and 156 can be stacked on top of one another, such that eight semiconductor elements 54, 74, 108, 126, 152, 154, 158, and 160 with eight layers of active circuitry 58 can be included. In some embodiments, any or all of these eight semiconductor elements can be device dies, e.g. memory dies.

By contrast, in conventional stacks, due to the handling limitations of thinned dies, such a structure would only include four device dies with four layers of active circuitry 58 (see FIGS. 1A-1B). As explained herein, in various embodiments, the semiconductor elements (e.g., the first semiconductor element 54) can comprise device dies, which in turn can comprise memory dies. In some embodiments, each memory die can be substantially identical to one another. Each bonded structure, e.g. 52 and 106 in FIG. 3B, can comprise a mirrored pair of memory dies (e.g., the dies can be arranged back-to-back (B2B) or front-to-front (F2F)). In various embodiments, a mirrored pair of dies can be provided by duplicating signal I/Os or by providing a redistribution layer (RDL) between the joined pairs. Thus, the disclosed embodiments can beneficially increase the density of circuitry so as to, for example, double a memory capacity of the stacked electronic device 50 as compared to the stacked structure 10 of FIGS. 1A-1B. These benefits have various applications, including, but not limited to, uses in high bandwidth memory (HBM) devices or other devices that utilize vertical integration. Alternative applications include the use of single-channel devices or multiple-channel devices (e.g., devices with two, three, or more channels). In such single-channel and multiple-channel device applications, a channel can comprise a connection path between a memory controller and a memory module (e.g., a dynamic random access memory (DRAM) module). Such a channel can comprise an electrical path along which a read/write signal is carried. In a single-channel application, one read or write signal can be carried at a time, whereas in a multiple-channel application, multiple read/write signals can be carried independently in parallel.

Further, as shown in FIG. 3E, the stacked electronic device 50 is symmetric about a horizontal axis, due to the paired and mirrored bonding method described above. Beneficially, therefore, in some embodiments, a neutral axis 100 can be disposed generally along a bond interface 98 in the middle of the stacked electronic device 50, e.g., between adjacent bonded structures 106 and 150. Having the neutral axis 100 in the middle of the stacked electronic device 50 can reduce stresses between the bonded structures 52, 106, 150, and 156 due to the symmetric arrangement. Thus, for any two bonded structures stacked on one another, the neutral axis 100 can extend generally along the bond interface 98 therebetween. In various embodiments, the neutral axis 100 of the stacked electronic device 50 can be vertically offset from the bond interface 98 by no more than 15%, by no more than 10%, or by no more than 5%, of a thickness 102 of the stacked first and second bonded structures 52 and 106 (shown in FIG. 3D). Various disclosed embodiments utilize two different mirrored (e.g., F2F or B2B configurations of) semiconductor elements (e.g., first and second semiconductor elements 54, 74) together, using contact pad-to-contact pad and TSV-to-TSV electrical connections. This can result in two-sided active circuitry 58 built on the same bonded structure (e.g., 52).

Figure 4A:
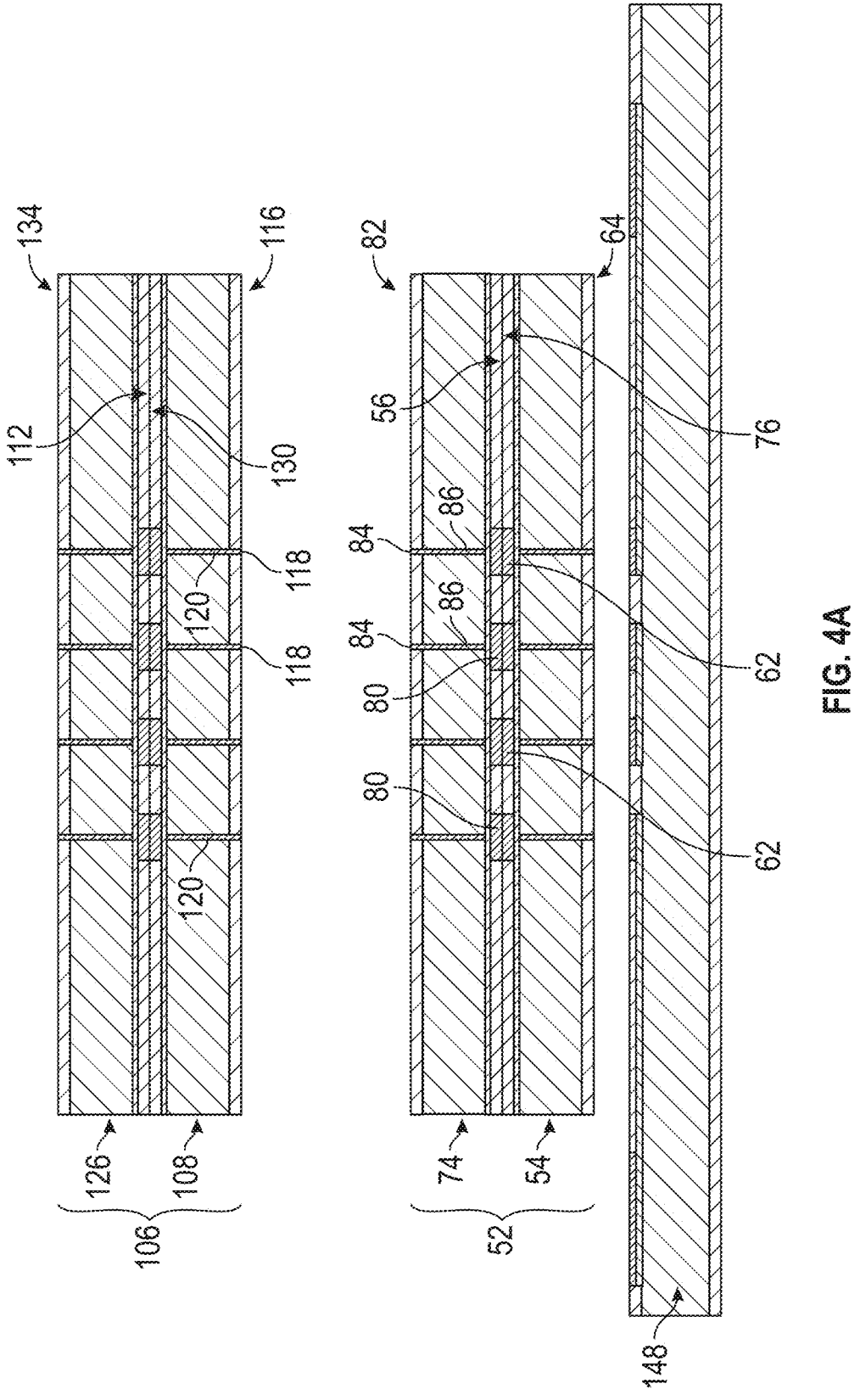
FIG. 4A is an exploded side sectional view of a stacked electronic device, according to one embodiment.
Figure 4B:
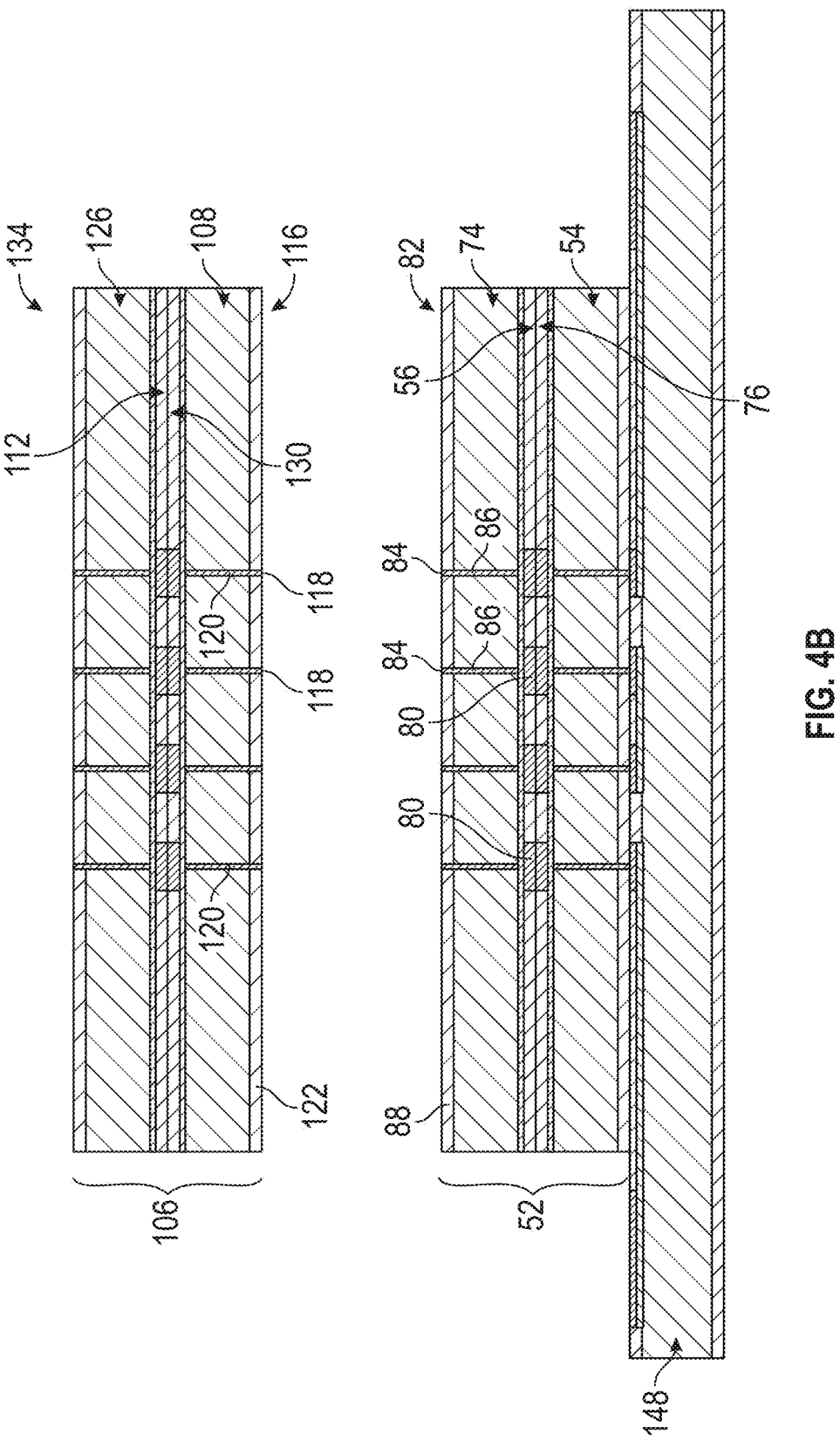
FIG. 4B is a schematic side sectional view of a first bonded structure bonded to a carrier and a second bonded structure prepared to be bonded to the first bonded structure, according to one embodiment.
Figure 4C:
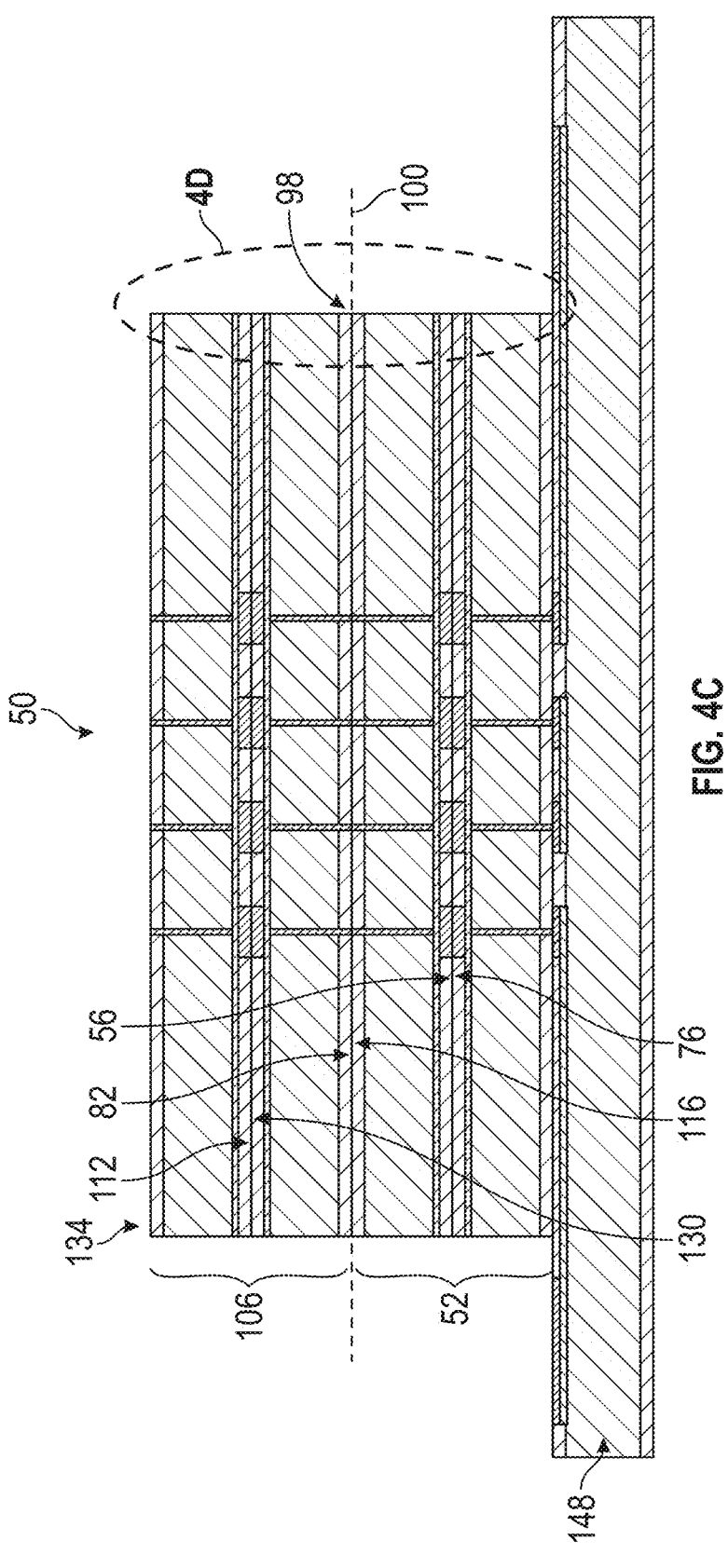
FIG. 4C is a schematic side sectional view of a stacked electronic device comprising two bonded structures, according to one embodiment.

FIGS. 4A-4E illustrate a method for forming a stacked electronic device 50 including a plurality of bonded structures 52, 106 bonded and electrically connected to one another. The method of FIGS. 4A-4E illustrates bonded first and second semiconductor elements 54, 74 and bonded third and fourth semiconductor elements 108, 126 that are bonded in a front-to-front (F2F) arrangement, as shown in FIG. 2D. As shown in FIG. 4B, a first bonded structure 52 comprising the first and second bonded semiconductor elements 54, 74 can be bonded to the carrier 148. In FIG. 4C, a second bonded structure 106 comprising bonded third and fourth semiconductor elements 108, 126 can be bonded and stacked on the first bonded structure 52. As shown, the third back side 116 of the third semiconductor element 108 of the second bonded structure 106 can be bonded to the second back side 82 of the second semiconductor element 74 of the first bonded structure 52. Backside nonconductive field regions 88, 122 of the back sides 82, 116 of the second and third semiconductor elements 74, 108 can be directly bonded without an intervening adhesive. A second plurality of TSVs 86 in the second semiconductor element 74 can be directly bonded to a third plurality of TSVs 120 in the third semiconductor element 108 without an intervening adhesive.

Figure 4D:
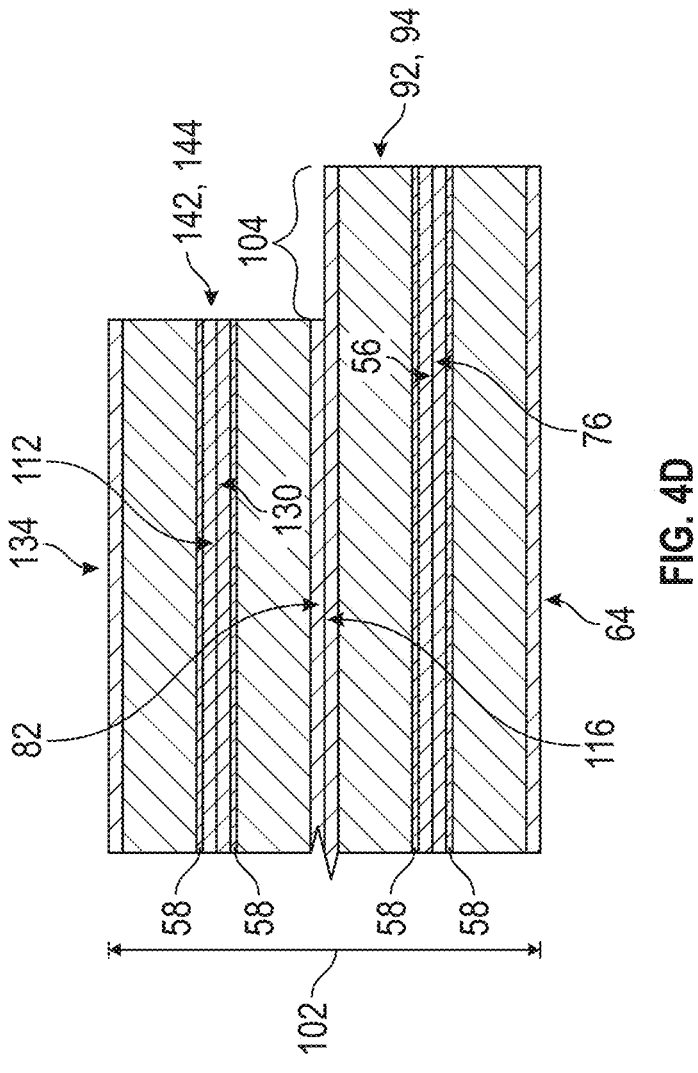
FIG. 4D is a schematic side sectional view of a side edge of the stacked first and second bonded structures, according to one embodiment.

Like FIG. 3D, FIG. 4D shows that at least because the first bonded structure 52 is bonded to the second bonded structure 106 after singulation in this embodiment, there is typically a lateral misalignment 104 between the side edge 92 of the first bonded structure 52 and the side edge 142 of the second bonded structure 106. Although the conductive features of the first bonded structure 52 may be substantially aligned with those of the second bonded structure 106 so as to retain bonding and electrical connection, due to differences in singulation processes and to the use of a bonding tool to bond the first and second bonded structures 52, 106 together, the side edge 92 of the first bonded structure 52 may not be flush with (e.g., may have a lateral misalignment 104 relative to or offset from) the side edge 142 of the second bonded structure 106.

Figure 4E:
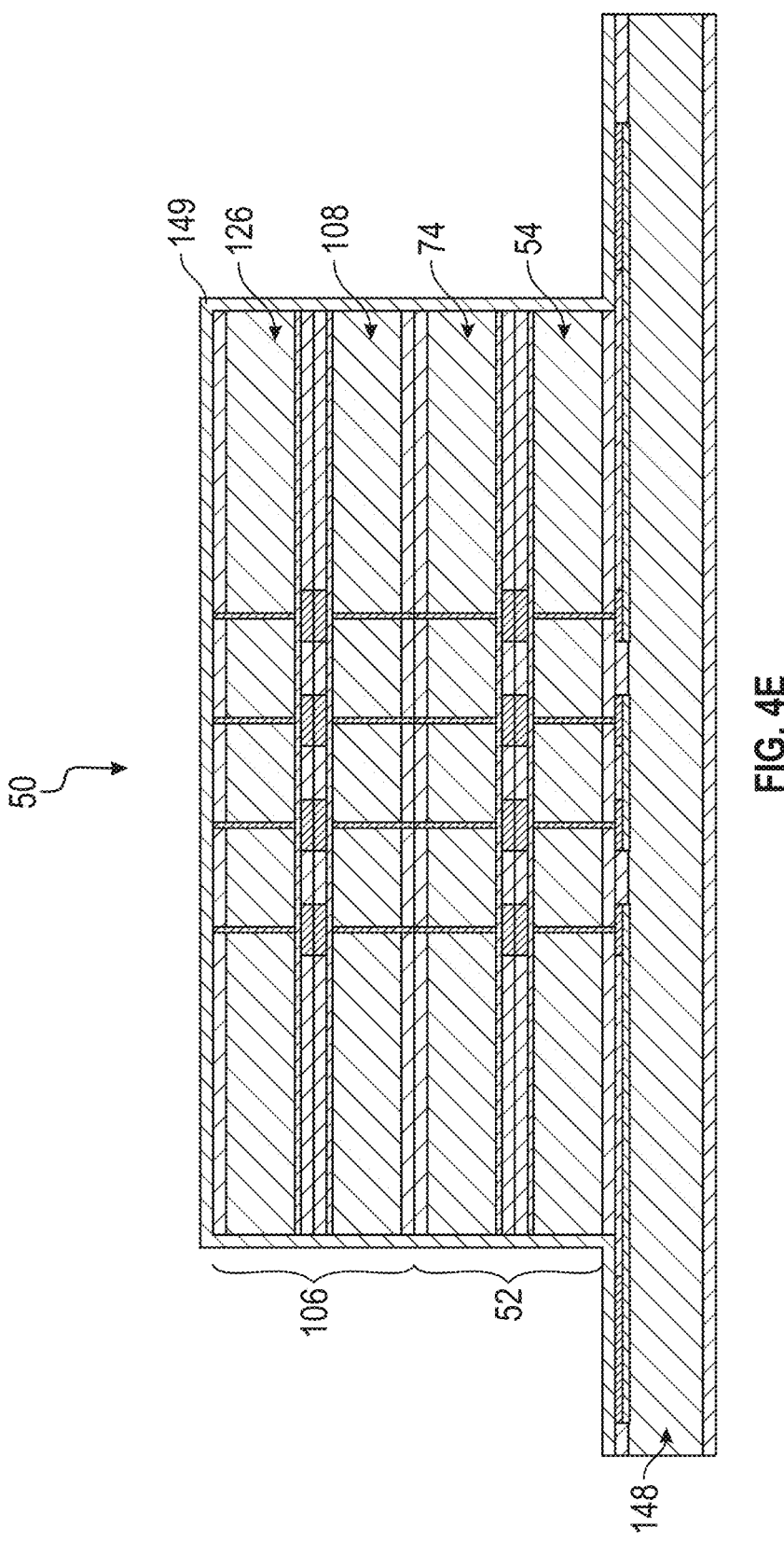
FIG. 4E is a schematic side sectional view of a stacked electronic device coated with a protective layer.

FIG. 4E shows the stacked electronic device 50, which includes a carrier 148, a first bonded structure 52 and a second bonded structure 106 bonded and electrically connected to one another. In some embodiments, as shown in FIG. 4E, a protective layer 149 can be used to coat and protect the stacked electronic device 50. The protective layer 149 is a nonconductive layer, such as a dielectric layer. It can be an organic dielectric layer (such as a polymer) or an inorganic dielectric layer (such as silicon oxide, silicon nitride, etc.).

Examples of Direct Bonding Methods and Directly Bonded Structures

Various embodiments disclosed herein relate to directly bonded structures in which two semiconductor elements can be directly bonded to one another without an intervening adhesive. Two or more semiconductor elements (such as integrated device dies, wafers, etc.) may be stacked on or bonded to one another to form a bonded structure. Conductive contact pads or conductive features of one semiconductor element may be electrically connected to corresponding conductive contact pads or conductive features of another semiconductor element. Any suitable number of semiconductor elements can be stacked in the bonded structure. The contact pads or conductive features may comprise metallic pads formed in a nonconductive field region, and may be connected to underlying metallization, such as a redistribution layer (RDL), an example of which is shown in FIG. 2A.

In some embodiments, the semiconductor elements are directly bonded to one another without an intervening adhesive. In various embodiments, a non-conductive or dielectric material (e.g., a nonconductive field region 60 or backside nonconductive field region 70, shown in FIG. 2A) of a first semiconductor element can be directly bonded to a corresponding non-conductive or dielectric field region of a second semiconductor element without an intervening adhesive. The non-conductive or dielectric material can be referred to as a nonconductive field region or bonding layer of the first semiconductor element. In some embodiments, the non-conductive or dielectric material of the first semiconductor element can be directly bonded to the corresponding non-conductive or dielectric material of the second semiconductor element using dielectric-to-dielectric bonding techniques. For example, dielectric-to-dielectric bonds may be formed without an intervening adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads or conductive features of the first semiconductor element can also be directly bonded to corresponding conductive contact pads or conductive features of the second semiconductor element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., any combination of a contact pad or conductive feature of one semiconductor element to a contact pad or conductive feature of another semiconductor element) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads and/or conductive features (which may be surrounded by dielectric nonconductive field regions) may also directly bond to one another without an intervening adhesive. In some embodiments, the respective contact pads and/or conductive features can be recessed below exterior (e.g., upper) surfaces of the nonconductive field regions, for example, recessed by less than 30 nm, less than 20 nm, less than 15 nm, or less than 10 nm, for example, recessed in a range of 2 nm to 20 nm, or in a range of 4 nm to 10 nm. The nonconductive field regions can be directly bonded to one another without an intervening adhesive at room temperature in some embodiments and, subsequently, the bonded structure can be annealed. Upon annealing, the contact pads and/or conductive features can expand and contact one another to form a metal-to-metal direct bond. Beneficially, the use of hybrid bonding techniques can enable high density of contact pads and/or conductive features connected across the direct bond interface (e.g., small or fine pitches for regular arrays). In some embodiments, the pitch of the bonding pads and/or conductive features embedded in the bonding surface of one of the bonded elements, may be less than 40 microns or less than 10 microns or even less than 2 microns. For some applications the ratio of the pitch of the bonding pads and/or conductive features to one of the dimensions of the bonding pad and/or conductive features is less than 5, or less than 3, or less than 2. In other applications the width 162 of the contact pads or conductive features (an example of which is shown in FIG. 2C) embedded in the bonding surface of one of the bonded semiconductor elements may range between 0.3 to 3 microns. In various embodiments, the contact pads and/or conductive features and/or traces can comprise copper, although other metals may be suitable.

Thus, in direct bonding processes, a first semiconductor element can be directly bonded to a second semiconductor element without an intervening adhesive. In some arrangements, the first semiconductor element can comprise a singulated element, such as a singulated integrated device die. In other arrangements, the first semiconductor element can comprise a carrier (e.g., a substrate, wafer, device, or another bonded structure) that includes a plurality (e.g., tens, hundreds, or more) of device regions that, when singulated, form a plurality of integrated device dies. Similarly, the second semiconductor element can comprise a singulated element, such as a singulated integrated device die. In other arrangements, the second semiconductor element can comprise a carrier (e.g., a substrate, wafer, device, or another bonded structure). In other embodiments, after directly bonding the first singulated semiconductor element (e.g., 54) to the second singulated semiconductor element (e.g., 54), the bonded stacked semiconductor elements may be molded to provide a lateral protective layer (not shown) to the bonded stacked semiconductor elements. In some applications, the robust molded, bonded stacked semiconductor elements can be mechanically and electrically connected to another device by various types of conductive material interconnection methods, such as direct bonding without intervening adhesive methods, solder ball, eutectic bonding methods, etc.

As explained herein, the first and second semiconductor elements can be directly bonded to one another without an intervening adhesive, which is different from a deposition process. As shown for example in FIG. 2B, in one application, a width 164 of the first semiconductor element 54 in the bonded structure can be similar to a width 166 of the second semiconductor element 74. In some other embodiments (not shown), the width of the first semiconductor element in the bonded structure can be different from the width of the second semiconductor element. The width or area of the larger semiconductor element in the bonded structure may be at least 10% larger than the width or area of the smaller semiconductor element. The first and second semiconductor elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentrations of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads and/or conductive features can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads and/or conductive features, such that there is substantially no gap between the nonconductive bonding regions at or near the bonded contact pads and/or conductive features. In some embodiments, a barrier layer (not shown) may be provided under the contact pads and/or conductive features (e.g., which may include copper). In other embodiments, however, there may be no barrier layer under the contact pads and/or conductive features, for example, as described in US 2019/0096741, which is incorporated by reference herein in its entirety and for all purposes.

In one embodiment, a stacked electronic device can include a first bonded structure. The first bonded structure can include a first semiconductor element having a first front side including active circuitry and a first back side opposite the first front side; and a second semiconductor element having a second front side including active circuitry and a second back side opposite the second front side, the first front side bonded and electrically connected to the second front side in an F2F configuration. The stacked electronic device can also include a second bonded structure. The second bonded structure can include a third semiconductor element having a third front side including active circuitry and a third back side opposite the third front side; and a fourth semiconductor element having a fourth front side including active circuitry and a fourth back side opposite the fourth front side, the third front side bonded and electrically connected to the fourth front side in an F2F configuration. The second back side of the second semiconductor element can be bonded and electrically connected to the third back side of the third semiconductor element in a B2B configuration.

In some embodiments, the first front side is directly bonded to the second front side without an intervening adhesive. In some embodiments, a first plurality of contact pads on the first front side are directly bonded to a second plurality of contact pads on the second front side without an intervening adhesive. In some embodiments, the first plurality of contact pads are at least partially embedded in a first nonconductive field region, wherein the second plurality of contact pads are at least partially embedded in a second nonconductive field region, and wherein the first and second nonconductive field regions are directly bonded without an intervening adhesive. In some embodiments, the second back side of the second semiconductor element is directly bonded to the third back side of the third semiconductor element without an intervening adhesive. In some embodiments, a first plurality of conductive features on the second back side are directly bonded to a second plurality of conductive features on the third back side without an intervening adhesive. In some embodiments, the first plurality of conductive features comprises a first plurality of through-substrate vias (TSVs) extending to the second back side and the second plurality of conductive features comprises a second plurality of through-substrate vias (TSVs) extending to the third back side. In some embodiments, the second back side includes a first backside nonconductive field region and the third back side includes a second backside nonconductive field region, the first and second backside nonconductive field regions directly bonded to one another without an intervening adhesive. In some embodiments, the first semiconductor element includes a first side edge between the first front side and the first back side, and the second semiconductor element includes a second side edge between the second front side and the second back side, wherein the first and second side edges are flush with one another to define a side edge of the first bonded structure. In some embodiments, the third semiconductor element includes a third side edge between the third front side and the third back side, and the fourth semiconductor element includes a fourth side edge between the fourth front side and the fourth back side, wherein the third and fourth side edges are flush with one another to define a side edge of the second bonded structure. In some embodiments, the side edge of the first bonded structure has a lateral misalignment relative to the side edge of the second bonded structure. In some embodiments, the side edge of the first bonded structure includes first markings indicative of a first singulation process, and wherein the side edge of the second bonded structure includes second markings indicative of a second singulation process different from the first singulation process. In some embodiments, the first bonded structure is bonded to the second bonded structure along a bond interface, and wherein a neutral axis of the stacked electronic structure is vertically offset from the bond interface by no more than 10% of a thickness of the stacked first and second bonded structures. In some embodiments, the neutral axis of the stacked electronic structure is vertically offset from the bond interface by no more than 5% of a thickness of the stacked first and second bonded structures. In some embodiments, the neutral axis of the stacked electronic structure extends substantially along the bond interface. In some embodiments, each of the first, second, third, and fourth semiconductor elements comprises a memory die. In some embodiments, each of the first, second, third, and fourth semiconductor elements are substantially identical to one another. In some embodiments, the first bonded structure comprises a mirrored pair of memory dies (e.g., either an F2F or a B2B configuration). In some embodiments, a thickness of the first bonded structure is no more than 100 microns. In some embodiments, the thickness of the first bonded structure is in a range of 20 microns to 100 microns. In some embodiments, the stacked electronic device can include a carrier, the second bonded structure stacked on the carrier, the carrier wider than the first and second bonded structures. In some embodiments, the stacked electronic device can include a third bonded structure including fifth and sixth bonded semiconductor elements, the third bonded structure bonded and electrically connected to the second bonded structure. In some embodiments, the stacked electronic device can include a fourth bonded structure including seventh and eighth bonded semiconductor elements, the fourth bonded structure bonded and electrically connected to the third bonded structure.

In another embodiment, a stacked electronic device can include a first bonded structure. The first bonded structure can include a first semiconductor element having a first front side including active circuitry and a first back side opposite the first front side; and a second semiconductor element having a second front side including active circuitry and a second back side opposite the second front side, the first back side bonded and electrically connected to the second back side. The stacked electronic device can also include a second bonded structure. The second bonded structure can include a third semiconductor element having a third front side including active circuitry and a third back side opposite the third front side; and a fourth semiconductor element having a fourth front side including active circuitry and a fourth back side opposite the fourth front side, the third back side bonded and electrically connected to the fourth back side. The second front side of the second semiconductor element can be bonded and electrically connected to the third front side of the third semiconductor element.

In some embodiments, the first back side is directly bonded to the second back side without an intervening adhesive. In some embodiments, a first plurality of through-substrate vias (TSVs) exposed on the first back side are directly bonded to a second plurality of TSVs on the second back side without an intervening adhesive. In some embodiments, a first backside nonconductive field region of the first back side is directly bonded to a second nonconductive field region of the second back side without an intervening adhesive. In some embodiments, the second front side of the second semiconductor element is directly bonded to the third front side of the third semiconductor element without an intervening adhesive. In some embodiments, the first semiconductor element includes a first side edge between the first front side and the first back side, and the second semiconductor element includes a second side edge between the second front side and the second back side, wherein the first and second side edges are flush with one another to define a side edge of the first bonded structure. In some embodiments, the third semiconductor element includes a third side edge between the third front side and the third back side, and the fourth semiconductor element includes a fourth side edge between the fourth front side and the fourth back side, wherein the third and fourth side edges are flush with one another to define a side edge of the second bonded structure. In some embodiments, the side edge of the first bonded structure has a lateral misalignment relative to the side edge of the second bonded structure. In some embodiments, the side edge of the first bonded structure includes first markings indicative of a first singulation process, and wherein the side edge of the second bonded structure includes second markings indicative of a second singulation process different from the first singulation process. In some embodiments, the first bonded structure is bonded to the second bonded structure along a bond interface, and wherein a neutral axis of the stacked electronic structure is vertically offset from the bond interface by no more than 10% of a thickness of the stacked first and second bonded structures. In some embodiments, the neutral axis of the stacked electronic structure is vertically offset from the bond interface by no more than 5% of a thickness of the stacked first and second bonded structures. In some embodiments, the neutral axis of the stacked electronic structure extends substantially along the bond interface. In some embodiments, each of the first, second, third, and fourth semiconductor elements comprises a memory die. In some embodiments, each of the first, second, third, and fourth semiconductor elements are substantially identical to one another. In some embodiments, the first bonded structure comprises a mirrored pair of memory dies. In some embodiments, a thickness of the first bonded structure is no more than 100 microns. In some embodiments, the thickness of the first bonded structure is in a range of 20 microns to 100 microns.

In another embodiment, a stacked electronic structure can include a first bonded structure including a first semiconductor die bonded to a second semiconductor die, each of the first and second semiconductor dies including a front side with active circuitry, a back side opposite the front side, and a side edge between the front and back sides, the respective side edges of the first and second semiconductor dies being flush with one another to define a first side edge of the first bonded structure. The stacked electronic structure can also include a second bonded structure stacked on and electrically connected to the first bonded structure, the second bonded structure including a third semiconductor die bonded to a fourth semiconductor die, each of the third and fourth semiconductor dies including a front side with active circuitry, a back side opposite the front side, and a side edge between the front and back sides, the respective side edges of the third and fourth semiconductor dies being flush with one another to define a second side edge of the second bonded structure. The first side edge of the first bonded structure can have a lateral misalignment relative to the second side edge of the second bonded structure.

In some embodiments, the back side of the first semiconductor die is direct hybrid bonded to the back side of the second semiconductor die without an intervening adhesive. In some embodiments, the front side of the second semiconductor die is direct hybrid bonded to the front side of the third semiconductor die. In some embodiments, the front side of the first semiconductor die is direct hybrid bonded to the front side of the second semiconductor die without an intervening adhesive. In some embodiments, the back side of the second semiconductor die is direct hybrid bonded to the back side of the third semiconductor die. In some embodiments, the back side of the first semiconductor die is direct hybrid bonded to the front side of the second semiconductor die without an intervening adhesive. In some embodiments, the back side of the second semiconductor die is direct hybrid bonded to the front side of the third semiconductor die.

In another embodiment, a stacked electronic structure can include a first bonded structure. The first bonded structure can include a first semiconductor die bonded to a second semiconductor die, each of the first and second semiconductor dies including a front side having active circuitry and a plurality of contact pads, a back side opposite the front side, and a plurality of through-substrate vias (TSVs) disposed between the plurality of contact pads and the back side. The stacked electronic structure can also include a second bonded structure stacked on and electrically connected to the first bonded structure along a bond interface. The second bonded structure can include a third semiconductor die bonded to a fourth semiconductor die, each of the third and fourth semiconductor dies including a front side having active circuitry and a plurality of contact pads, a back side opposite the front side, and a plurality of through-substrate vias (TSVs) disposed between the plurality of contact pads and the back side. A neutral axis of the stacked electronic structure can be vertically offset from the bond interface by no more than 15% of a thickness of the stacked first and second bonded structures.

In some embodiments, the back side of the first semiconductor die is direct hybrid bonded to the back side of the second semiconductor die without an intervening adhesive. In some embodiments, the front side of the second semiconductor die is direct hybrid bonded to the front side of the third semiconductor die. In some embodiments, the front side of the first semiconductor die is direct hybrid bonded to the front side of the second semiconductor die without an intervening adhesive. In some embodiments, the back side of the second semiconductor die is direct hybrid bonded to the back side of the third semiconductor die. In some embodiments, the back side of the first semiconductor die is direct hybrid bonded to the front side of the second semiconductor die without an intervening adhesive. In some embodiments, the back side of the second semiconductor die is direct hybrid bonded to the front side of the third semiconductor die.

In another embodiment, a stacked electronic structure can include a first bonded structure including a first semiconductor die bonded to a second semiconductor die, each of the first and second semiconductor dies including a front side having active circuitry and a plurality of contact pads, a back side opposite the front side, and a plurality of through-substrate vias (TSVs) disposed between the plurality of contact pads and the back side. A thickness of the first bonded structure can be no more than 90 microns.

In some embodiments, the stacked electronic device can include a second bonded structure stacked on and electrically connected to the first bonded structure along a bond interface, the second bonded structure including a third semiconductor die bonded to a fourth semiconductor die, each of the third and fourth semiconductor dies including a front side having active circuitry and a plurality of contact pads, a back side opposite the front side, and a plurality of through-substrate vias (TSVs) disposed between the plurality of contact pads and the back side.

In another embodiment, a method of forming a stacked electronic device can include: bonding a first semiconductor element to a second semiconductor element to form a first bonded structure; and stacking and electrically connecting the first bonded structure to a carrier.

In some embodiments, stacking and electrically connecting the first bonded structure to a carrier comprises stacking and electrically connecting the first bonded structure to a host wafer or device. In some embodiments, stacking and electrically connecting the first bonded structure to a carrier comprises stacking and electrically connecting the first bonded structure to a second bonded structure. In some embodiments, the method can include bonding a third semiconductor element to a fourth semiconductor element to form the second bonded structure before bonding the first bonded structure to the second bonded structure. In some embodiments, bonding the first semiconductor element to the second semiconductor element comprises directly bonding the first semiconductor element to the second semiconductor element without an intervening adhesive. In some embodiments, bonding the third semiconductor element to the fourth semiconductor element comprises directly bonding the third semiconductor element to the fourth semiconductor element without an intervening adhesive. In some embodiments, stacking and electrically connecting the first bonded structure to the second bonded structure comprises directly bonding the first bonded structure to the second bonded structure without an intervening adhesive. In some embodiments, bonding the first semiconductor element to the second semiconductor element comprises bonding a first active front side of the first semiconductor element to a second active front side of the second semiconductor element, and bonding the third semiconductor element to the fourth semiconductor element comprises bonding a third active front side of the third semiconductor element to a fourth active front side of the fourth semiconductor element. In some embodiments, stacking and electrically connecting the first bonded structure to the second bonded structure comprises bonding a second back side of the second semiconductor element to a third back side of the third semiconductor element. In some embodiments, bonding the first active front side of the first semiconductor element to the second active front side of the second semiconductor element comprises directly bonding a first plurality of contact pads on the first active front side to a second plurality of contact pads on the second active front side without an intervening adhesive, and bonding the third active front side of the third semiconductor element to the fourth active front side of the fourth semiconductor element comprises directly bonding a third plurality of contact pads on the third active front side to a fourth plurality of contact pads on the fourth active front side without an intervening adhesive. In some embodiments, the method can include directly bonding respective nonconductive field regions of the first and second active front sides without an intervening adhesive. In some embodiments, bonding the second back side of the second semiconductor element to the third back side of the third semiconductor element comprises directly bonding a first plurality of through-substrate vias (TSVs) on the second back side to a second plurality of through-substrate vias (TSVs) on the third back side without an intervening adhesive. In some embodiments, bonding the first semiconductor element to the second semiconductor element comprises bonding a first back side of the first semiconductor element to a second back side of the second semiconductor element, and bonding the third semiconductor element to the fourth semiconductor element comprises bonding a third back side of the third semiconductor element to a fourth back side of the fourth semiconductor element. In some embodiments, bonding the first semiconductor element to the second semiconductor element comprises directly bonding a first plurality of through-substrate vias (TSVs) on the first back side to a second plurality of through-substrate vias (TSVs) on the second back side without an intervening adhesive. In some embodiments, the method can include directly bonding a first backside nonconductive field region on the first back side to a second backside nonconductive field region on the second back side without an intervening adhesive. In some embodiments, stacking and electrically connecting the first bonded structure to the second bonded structure comprises bonding a second active front side of the second semiconductor element to a third active front side of the third semiconductor element. In some embodiments, bonding the first semiconductor element to the second semiconductor element comprises bonding a first back side of the first semiconductor element to a second active front side of the second semiconductor element, and wherein bonding the third semiconductor element to the fourth semiconductor element comprises bonding a third back side of the third semiconductor element to a fourth active front side of the fourth semiconductor element. In some embodiments, the method can include thinning the first and second semiconductor elements. In some embodiments, the thinning is performed before bonding the first and second semiconductor elements. In some embodiments, the thinning is performed after bonding the first and second semiconductor elements. In some embodiments, thinning the first and second semiconductor elements comprises thinning the first and second semiconductor elements in wafer form. In some embodiments, the method can include singulating the first bonded structure after the thinning and after bonding the first and second semiconductor elements.

In another embodiment, a stacked electronic structure can include: a first bonded structure including a first semiconductor die bonded to a second semiconductor die, each of the first and second semiconductor dies including a front side having active circuitry and a plurality of contact pads, a back side opposite the front side, and a plurality of through-substrate vias (TSVs) disposed between the plurality of contact pads and the back side. A thickness of the first bonded structure can be no more than 80 microns and the bonded die stack can be laterally coated with a protective layer.

In some embodiments, the stacked electronic structure can include a second bonded structure stacked on and electrically connected to the first bonded structure along a bond interface, the second bonded structure including a third semiconductor die bonded to a fourth semiconductor die, each of the third and fourth semiconductor dies including a front side having active circuitry and a plurality of contact pads, a back side opposite the front side, and a plurality of through-substrate vias (TSVs) disposed between the plurality of contact pads and the back side.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A stacked electronic device comprising:
a first bonded structure comprising:
    a first semiconductor element having a first front side including active circuitry and a first back side opposite the first front side; and a second semiconductor element having a second front side including active circuitry and a second back side opposite the second front side, the first front side bonded and electrically connected to the second front side; and
a second bonded structure comprising:
    a third semiconductor element having a third front side including active circuitry and a third back side opposite the third front side; and
    a fourth semiconductor element having a fourth front side including active circuitry and a fourth back side opposite the fourth front side, the third front side bonded and electrically connected to the fourth front side,
wherein the second back side of the second semiconductor element is bonded and electrically connected to the third back side of the third semiconductor element, and
wherein a side edge of the first bonded structure extending from the first back side to the second back side has a lateral misalignment relative to a side edge of the second bonded structure extending from the third back side to the fourth back side.

2. The stacked electronic device of claim 1, wherein the first front side is directly bonded to the second front side without an intervening adhesive, and wherein the second back side of the second semiconductor element is directly bonded to the third back side of the third semiconductor element without an intervening adhesive.

3. The stacked electronic device of claim 2, wherein a first plurality of contact pads on the first front side are directly bonded to a second plurality of contact pads on the second front side without an intervening adhesive; wherein the first plurality of contact pads are at least partially embedded in a first nonconductive field region; wherein the second plurality of contact pads are at least partially embedded in a second nonconductive field region; and wherein the first and second nonconductive field regions are directly bonded without an intervening adhesive.

4. The stacked electronic device of claim 3, wherein a first plurality of conductive features on the second back side are directly bonded to a second plurality of conductive features on the third back side without an intervening adhesive; wherein the first plurality of conductive features comprises a first plurality of through-substrate vias (TSVs) extending to the second back side and the second plurality of conductive features comprises a second plurality of through-substrate vias (TSVs) extending to the third back side; and wherein the second back side includes a first backside nonconductive field region and the third back side includes a second backside nonconductive field region, the first and second backside nonconductive field regions directly bonded to one another without an intervening adhesive.

5. The stacked electronic device of claim 1, wherein the first semiconductor element includes a first side edge between the first front side and the first back side, and the second semiconductor element includes a second side edge between the second front side and the second back side, wherein the first and second side edges are flush with one another to define the side edge of the first bonded structure.

6. The stacked electronic device of claim 5, wherein the third semiconductor element includes a third side edge between the third front side and the third back side, and the fourth semiconductor element includes a fourth side edge between the fourth front side and the fourth back side, wherein the third and fourth side edges are flush with one another to define the side edge of the second bonded structure, wherein the side edge of the first bonded structure includes first markings indicative of a first singulation process, and wherein the side edge of the second bonded structure includes second markings indicative of a second singulation process different from the first singulation process.

7. The stacked electronic device of claim 6, wherein the first bonded structure is bonded to the second bonded structure along a bond interface, and wherein a neutral axis of the stacked electronic structure is vertically offset from the bond interface by no more than 10% of a thickness of the stacked first and second bonded structures.

8. The stacked electronic device of claim 7, wherein the first bonded structure comprises a mirrored pair of memory dies.

9. The stacked electronic device of claim 1, wherein a thickness of the first bonded structure is no more than 100 microns.

10. The stacked electronic device of claim 1, further comprising a third bonded structure including fifth and sixth bonded semiconductor elements, the third bonded structure bonded and electrically connected to the second bonded structure.

11. The stacked electronic device of claim 10, further comprising a fourth bonded structure including seventh and eighth bonded semiconductor elements, the fourth bonded structure bonded and electrically connected to the third bonded structure.

12. A stacked electronic structure comprising:
a first bonded structure including a first semiconductor die bonded to a second semiconductor die, each of the first and second semiconductor dies including a front side with active circuitry, a back side opposite the front side, and a side edge between the front and back sides, the respective side edges of the first and second semiconductor dies being flush with one another to define a first side edge of the first bonded structure; and
a second bonded structure stacked on and electrically connected to the first bonded structure at a bond location, forming a conductive path across the bond location between the first and second bonded structure, the second bonded structure including a third semiconductor die bonded to a fourth semiconductor die, each of the third and fourth semiconductor dies including a front side with active circuitry, a back side opposite the front side, and a side edge between the front and back sides, the respective side edges of the third and fourth semiconductor dies being flush with one another to define a second side edge of the second bonded structure,
wherein the first side edge of the first bonded structure has a lateral misalignment relative to the second side edge of the second bonded structure.

13. The stacked electronic device of claim 12, wherein the back side of the first semiconductor die is direct hybrid bonded to the back side of the second semiconductor die without an intervening adhesive.

14. The stacked electronic device of claim 13, wherein the front side of the second semiconductor die is direct hybrid bonded to the front side of the third semiconductor die.

15. The stacked electronic device of claim 12, wherein the front side of the first semiconductor die is direct hybrid bonded to the front side of the second semiconductor die without an intervening adhesive.

16. The stacked electronic device of claim 15, wherein the back side of the second semiconductor die is direct hybrid bonded to the back side of the third semiconductor die.

17. The stacked electronic device of claim 12, wherein the back side of the first semiconductor die is direct hybrid bonded to the front side of the second semiconductor die without an intervening adhesive.

18. The stacked electronic device of claim 17, wherein the back side of the second semiconductor die is direct hybrid bonded to the front side of the third semiconductor die.

19. The stacked electronic device of claim 12, wherein the second bonded structure is stacked on and solder bonded to the first bonded structure.

20. The stacked electronic device of claim 12, wherein the second bonded structure is stacked on and hybrid bonded to the first bonded structure.

21. A stacked electronic structure comprising:
a first bonded structure including a first semiconductor die bonded to a second semiconductor die, each of the first and second semiconductor dies including a front side having active circuitry and a plurality of contact pads, a back side opposite the front side, and a plurality of through-substrate vias (TSVs) disposed between the plurality of contact pads and the back side; and
a second bonded structure stacked on and electrically connected to the first bonded structure along a bond interface, the second bonded structure including a third semiconductor die bonded to a fourth semiconductor die, each of the third and fourth semiconductor dies including a front side having active circuitry and a plurality of contact pads, a back side opposite the front side, and a plurality of through-substrate vias (TSVs) disposed between the plurality of contact pads and the back side,
wherein a neutral axis of the stacked electronic structure is vertically offset from the bond interface by no more than 15% of a thickness of the stacked first and second bonded structures.

22. The stacked electronic device of claim 21, wherein the back side of the first semiconductor die is direct hybrid bonded to the back side of the second semiconductor die without an intervening adhesive.

* * * * *